(12) United States Patent
Lin et al.

(10) Patent No.: US 12,336,271 B2
(45) Date of Patent: Jun. 17, 2025

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Shih-Yao Lin, New Taipei (TW); Chen-Ping Chen, Toucheng Township (TW); Chen-Yui Yang, Hsinchu (TW); Hsiao Wen Lee, Hsinchu (TW); Ming-Ching Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 877 days.

(21) Appl. No.: 17/460,203

(22) Filed: Aug. 28, 2021

(65) Prior Publication Data
US 2023/0067425 A1    Mar. 2, 2023

(51) Int. Cl.
| | |
|---|---|
| *H10D 62/80* | (2025.01) |
| *H10D 84/01* | (2025.01) |
| *H10D 84/03* | (2025.01) |
| *H10D 84/83* | (2025.01) |
| *H01L 21/3213* | (2006.01) |

(52) U.S. Cl.
CPC ....... *H10D 84/038* (2025.01); *H10D 84/0135* (2025.01); *H10D 84/0149* (2025.01); *H10D 84/0151* (2025.01); *H10D 84/83* (2025.01); *H01L 21/32134* (2013.01); *H01L 21/32137* (2013.01)

(58) Field of Classification Search
None
See application file for complete search history.

(56) References Cited

U.S. PATENT DOCUMENTS

| | | | |
|---|---|---|---|
| 2019/0341450 A1* | 11/2019 | Lee | H01L 21/823864 |
| 2020/0058653 A1* | 2/2020 | Chiang | H01L 29/24 |

* cited by examiner

*Primary Examiner* — Joseph C. Nicely
*Assistant Examiner* — Lamont B Koo
(74) *Attorney, Agent, or Firm* — FOLEY & LARDNER LLP

(57) ABSTRACT

A semiconductor device includes a first plurality of channel layers. The first plurality of channel layers extend along a first direction. The semiconductor device includes a second plurality of channel layers. The second plurality of channel layers also extend along the first direction. The semiconductor de123329-vice includes a first dielectric fin structure that also extends along the first direction. The semiconductor device includes a first gate structure that extends along a second direction. The first gate structure comprises a first portion that wraps around each of the first plurality of channel layers and a second portion that wraps around each of the second plurality of channel layers. The first dielectric fin structure separates the first and second portions from each other. The first gate structure comprises a third portion that connects the first and second portions to each other and is vertically disposed below the first dielectric fin structure.

20 Claims, 19 Drawing Sheets

SEMICONDUCTOR DEVICES AND METHODS OF MANUFACTURING THEREOF

BACKGROUND

The present disclosure generally relates to semiconductor devices, and particularly to methods of making a non-planar transistor device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
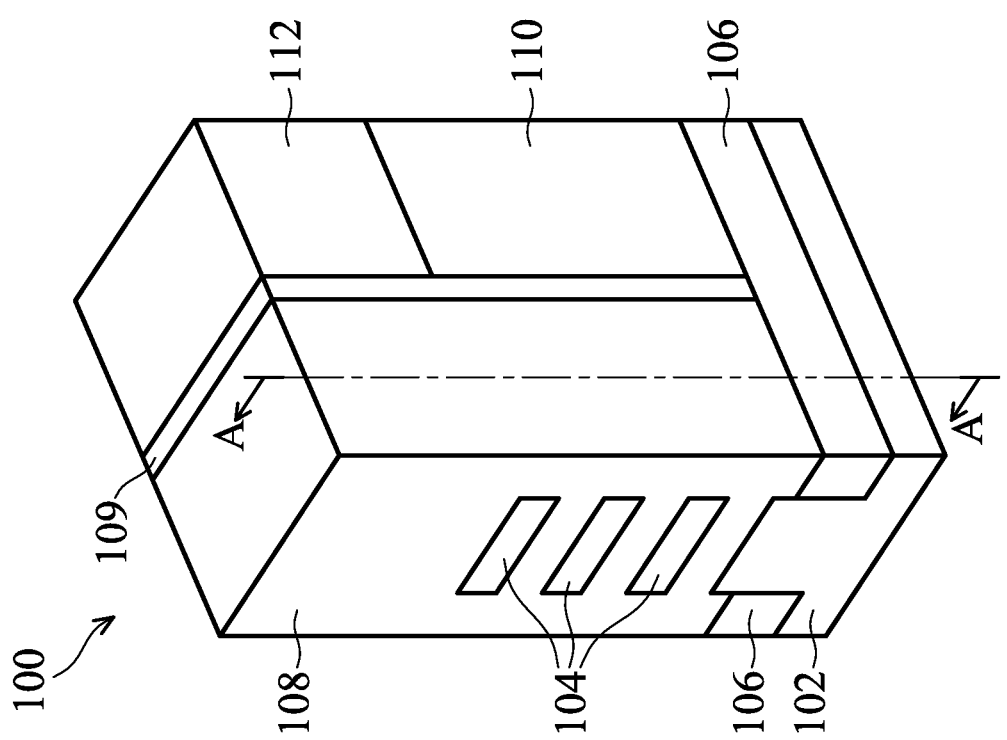
FIG. 1 illustrates a perspective view of a gate-all-around (GAA) field-effect-transistor (FET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a gate-all-around (GAA) field-effect-transistor (FET) device, and in particular, in the context of forming a number of GAA transistors, some of which are configured to conduct a higher level of current and some of which are configured to conduct a lower level of current. For example, an active gate structure may include multiple portions that wrap around different stacks of channel layers, respectively. As disclosed herein, such "wrapping" portions may be connected to one another through one or more portions that laterally extend between the neighboring stacks of channel layers. The "connecting" portions can be formed by replacing a portion of a cladding layer that laterally extends between the neighboring stacks, in accordance with various embodiments. By connecting different portions of an active gate structure, the active gate structure can simultaneously conduct multiple channels, which can generate a relatively high level of current.

FIG. 1 illustrates a perspective view of an example GAA FET device 100, in accordance with various embodiments. The GAA FET device 100 includes a substrate 102 and a number of semiconductor layers (e.g., nanosheets, nanowires, or otherwise nanostructures) 104 above the substrate 102. The semiconductor layers 104 are vertically separated from one another, which can collectively function as a (conduction) channel of the GAA FET device 100. Isolation regions/structures 106 are formed on opposing sides of a protruding portion of the substrate 102, with the semiconductor layers 104 disposed above the protruding portion. A gate structure 108 wraps around each of the semiconductor layers 104 (e.g., a full perimeter of each of the semiconductor layers 104). A spacer 109 extends along each sidewall of the gate structure 108. Source/drain structures are disposed on opposing sides of the gate structure 108 with the spacer 109 disposed therebetween, e.g., source/drain structure 110 shown in FIG. 1. An interlayer dielectric (ILD) 112 is disposed over the source/drain structure 110.

The GAA FET device shown in FIG. 1 is simplified, and thus, it should be understood that one or more features of a completed GAA FET device may not be shown in FIG. 1. For example, the other source/drain structure opposite the gate structure 108 from the source/drain structure 110 and the ILD disposed over such a source/drain structure are not shown in FIG. 1. Further, FIG. 1 is provided as a reference to illustrate a number of cross-sections in subsequent figures. As indicated, cross-section A-A is cut along a longitudinal axis of the gate structure 108. Subsequent figures refer to this reference cross-section for clarity.

Figure 2:
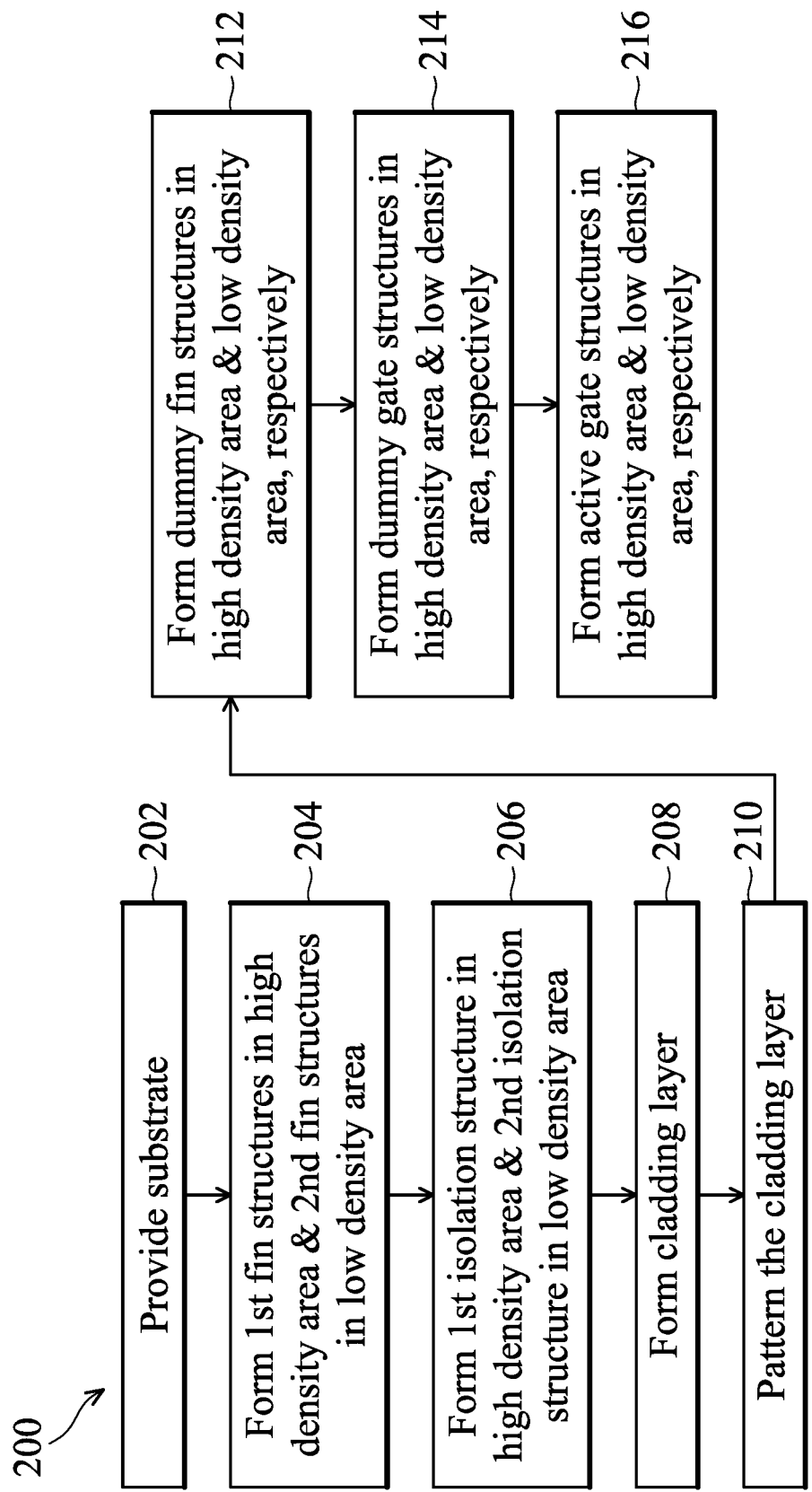
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device, a GAA FET device (e.g., GAA FET device 100), a nanosheet transistor device, a nanowire transistor device, a vertical transistor device, a gate-all-around (GAA) transistor device, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example GAA FET device at various fabrication stages as shown in FIGS. 3, 4, 5, 6, 7A, 7B, 8A, 8B, 9A, 9B, 10A, 10B, 11A, 11B, 12A, and 12B, respectively, which will be discussed in further detail below.

In brief overview, the method 200 starts with operation 202 of providing a substrate. The method 200 continues to operation 204 of forming a number of first fin structures in a high density area and a number of second fin structures in a low density area. Each of the fin structures includes a number of first semiconductor layers and a number of second semiconductor layers. The method 200 continues to operation 206 of forming a first isolation structure in the high density area and a second isolation structure in the low density area. The method 200 continues to operation 208 of forming a cladding layer. The method 200 continues to operation 210 of patterning the cladding layer. The method 200 continues to operation 212 of forming a number of dummy fin structures in the high density area and a number of dummy fin structures in the low density area. The method 200 continues to operation 214 of forming a first dummy gate structure in the high density area and a second dummy gate structure in the low density area. The method 200 continues to operation 216 of forming a first active gate structure and a second active gate structure in the high density area and low density area, respectively.

As mentioned above, FIGS. 3-12B each illustrate, in a cross-sectional view, a portion of a GAA FET device 300 at various fabrication stages of the method 200 of FIG. 2. The GAA FET device 300 is similar to the GAA FET device 100 shown in FIG. 1, but with certain features/structures/regions not shown, for the purposes of brevity. For example, the following figures of the GAA FET device 300 do not include source/drain structures (e.g., 110 of FIG. 1). It should be understood the GAA FET device 300 may further include a number of other devices (not shown in the following figures) such as inductors, fuses, capacitors, coils, etc., while remaining within the scope of the present disclosure.

Figure 3:
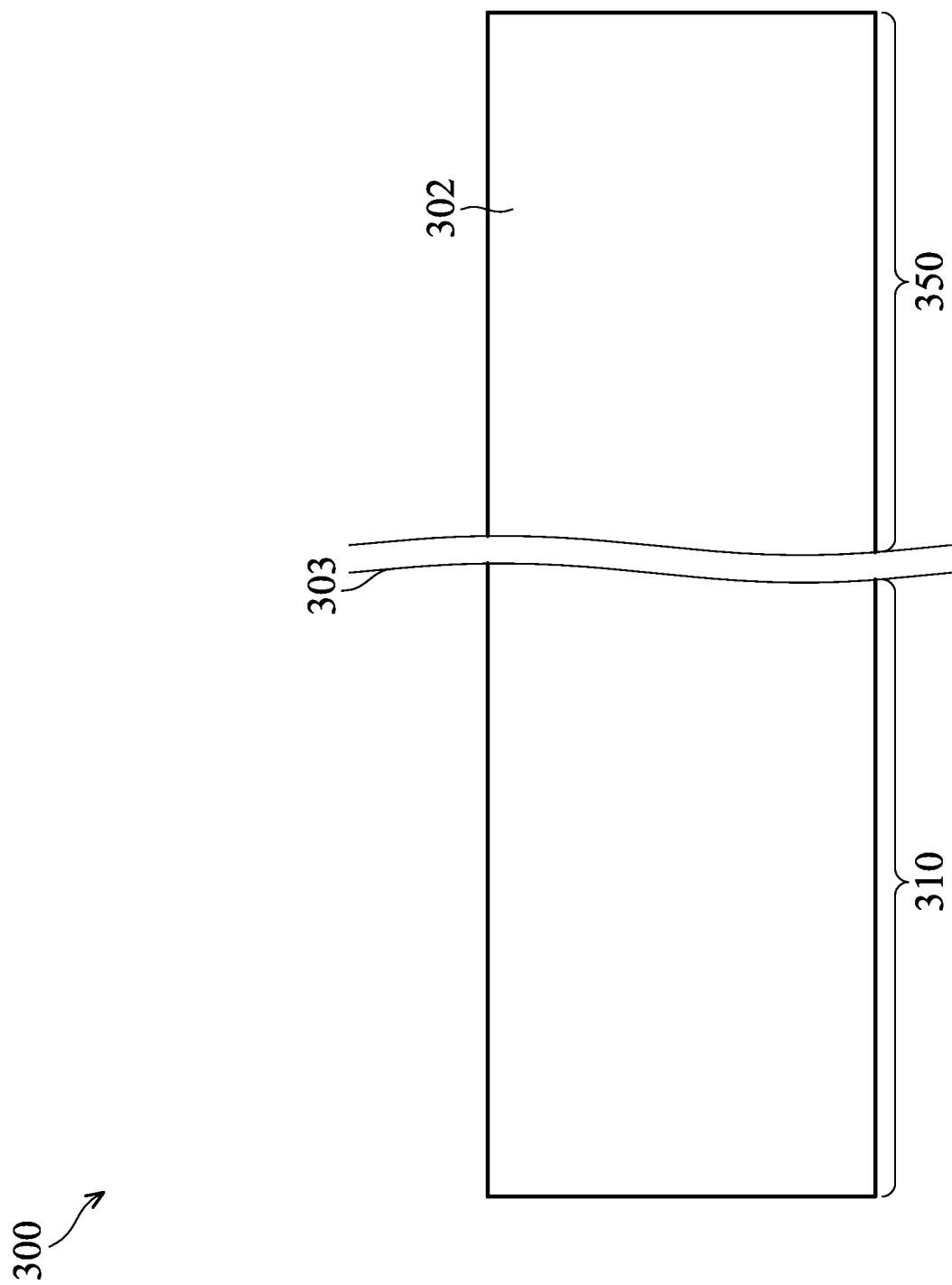
FIGS. 3, 4, 5, 6, 7A, 7B, 8A, 8B, 9A, 9B, 10A, 10B, 11A, 11B, 12A, and 12B illustrate cross-sectional views of an example GAA FET device (or a portion of the example GAA FET device) during various fabrication stages, made by the method of FIG. 2, in accordance with some embodiments.

Corresponding to operation 202 of FIG. 2, FIG. 3 is a cross-sectional view of the GAA FET device 300 including a semiconductor substrate 302 at one of the various stages of fabrication. The cross-sectional view of FIG. 3 is cut in a direction along the lengthwise direction of an active/dummy gate structure of the GAA FET device 300 (e.g., cross-section A-A indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the substrate 302 can include areas 310 and 350. The area 310 can be configured to form a number of transistors in a relatively high gate density (which is sometimes referred to as "high density area 310"); and the area 350 can be configured to form a number of transistors in a relatively low gate density (which is referred to as "low density area 350"). Accordingly, features (e.g., fins) of the transistors in the low density area 350 may be more sparsely formed, when compared to features (e.g., fins) of the transistors formed in the high density area 310.

As shown in FIG. 3 (and the following figures), the high density area 310 and low density area 350 are separated from each other by a divider 303, which can include additional features/components/devices that are omitted for simplicity. It should be appreciated that some of the operations of the method 200 may be concurrently performed in the areas 310 and 350. For purposes of illustration, the feature(s) formed in the areas 310 and 350 may be shown in the same figure that corresponds to one of the operations of the method 200.

Figure 4:
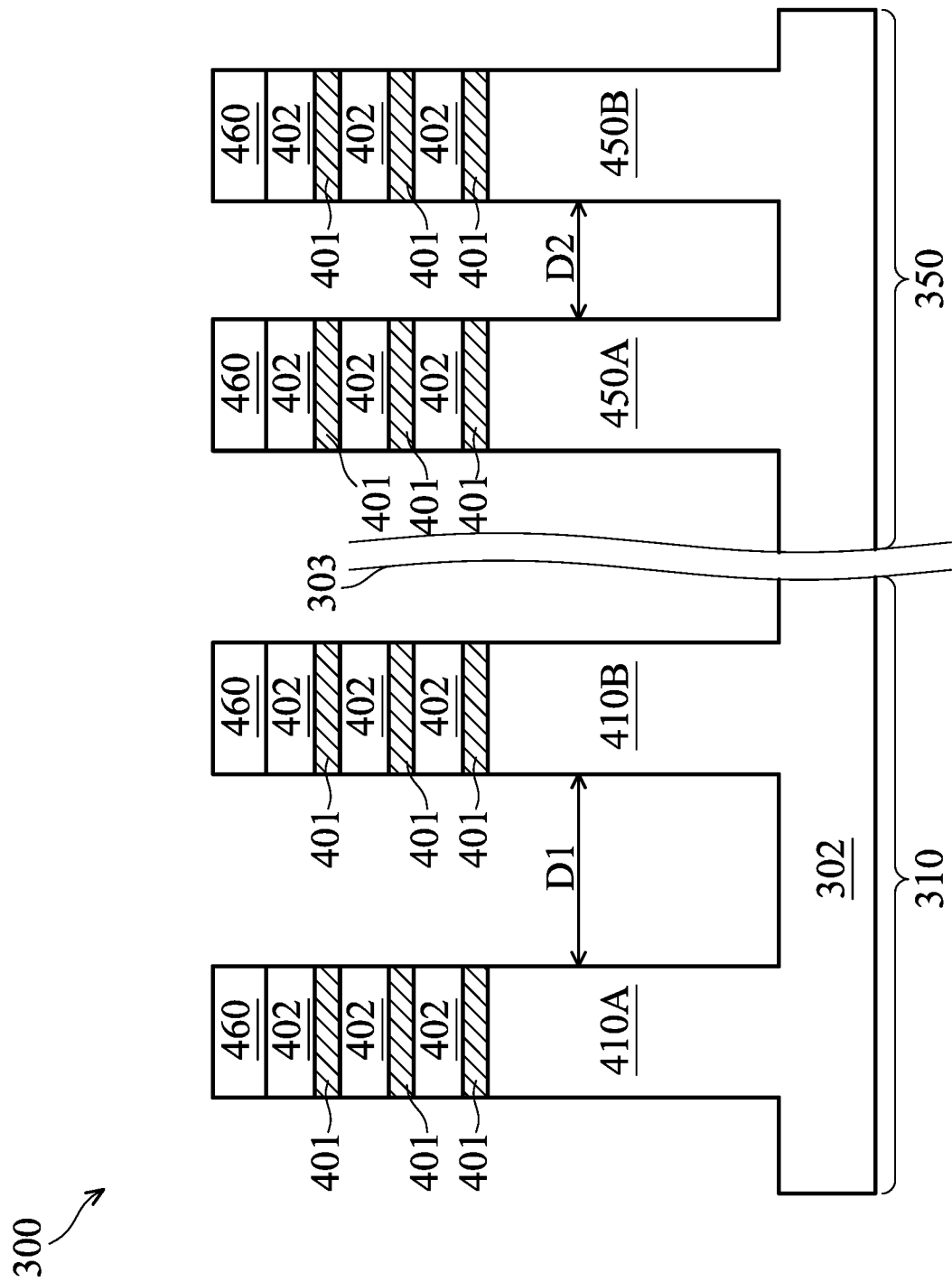

Corresponding to operation 204 of FIG. 2, FIG. 4 is a cross-sectional view of the GAA FET device 300 including a number of fin structures 410A and 410B formed in the area 310 and a number of fin structures 450A and 450B in the area 350, at one of the various stages of fabrication. The cross-sectional view of FIG. 4 is cut in a direction along the lengthwise direction of an active/dummy gate structure of the GAA FET device 300 (e.g., cross-section A-A indicated in FIG. 1). Although two fin structures are formed in each of the areas 310 and 350 in the illustrated embodiment of FIG. 4, it should be understood that the GAA FET device 300 can include any number of fin structures in each area of the substrate 302, while remaining within the scope of present disclosure.

To form the fin structures 410A-B and 450A-B, a number of first semiconductor layers 401 and a number of second semiconductor layers 402 are alternatingly disposed on top of one another to form a stack. For example, one of the second semiconductor layers 402 is disposed over one of the first semiconductor layers 401 then another one of the first semiconductor layers 401 is disposed over the second semiconductor layer 402, so on and so forth. The stack may include any number of alternately disposed first and second semiconductor layers 401 and 402. For example in the illustrated embodiments of FIG. 4 (and the following figures), the stack may include 3 first semiconductor layers 401, with 3 second semiconductor layers 402 alternatingly disposed therebetween and with one of the second semiconductor layers 402 being the topmost semiconductor layer. It should be understood that the GAA FET device 300 can include any number of first semiconductor layers and any number of second semiconductor layers, with either one of the first or second semiconductor layers being the topmost semiconductor layer, while remaining within the scope of the present disclosure.

The semiconductor layers 401 and 402 may have respective different thicknesses. Further, the first semiconductor layers 401 may have different thicknesses from one layer to another layer. The second semiconductor layers 402 may have different thicknesses from one layer to another layer. The thickness of each of the semiconductor layers 401 and 402 may range from few nanometers to few tens of nanometers. The first layer of the stack may be thicker than other semiconductor layers 401 and 402. In an embodiment, each of the first semiconductor layers 401 has a thickness ranging from about 5 nanometers (nm) to about 20 nm, and each of the second semiconductor layers 402 has a thickness ranging from about 5 nm to about 20 nm.

The two semiconductor layers 401 and 402 may have different compositions. In various embodiments, the two semiconductor layers 401 and 402 have compositions that provide for different oxidation rates and/or different etch selectivity between the layers. In an embodiment, the first semiconductor layers 401 may each include silicon germanium ($Si_{1-x}Ge_x$), and the second semiconductor layers may each include silicon (Si). In an embodiment, each of the semiconductor layers 402 is silicon that may be undoped or substantially dopant-free (i.e., having an extrinsic dopant concentration from about 0 $cm^{-3}$ to about $1\times10^{17}$ $cm^{-3}$), where for example, no intentional doping is performed when forming the layers 402 (e.g., of silicon).

In various embodiments, the semiconductor layers 402 may be intentionally doped. For example, when the GAA FET device 300 is configured as an n-type transistor (and operates in an enhancement mode), each of the semiconductor layers 402 may be silicon that is doped with a p-type dopant such as boron (B), aluminum (Al), indium (In), and gallium (Ga); and when the GAA FET device 300 is configured as a p-type transistor (and operates in an enhancement mode), each of the semiconductor layers 402 may be silicon that is doped with an n-type dopant such as phosphorus (P), arsenic (As), antimony (Sb). In another example, when the GAA FET device 300 is configured as an n-type transistor (and operates in a depletion mode), each of the semiconductor layers 402 may be silicon that is doped with an n-type dopant instead; and when the GAA FET device 300 is configured as a p-type transistor (and operates in a depletion mode), each of the semiconductor layers 402 may be silicon that is doped with a p-type dopant instead.

In some embodiments, each of the semiconductor layers 401 is $Si_{1-x}Ge_x$ that includes less than 50% (x<0.5) Ge in molar ratio. For example, Ge may comprise about 15% to 35% of the semiconductor layers 401 of $Si_{1-x}Ge_x$ in molar ratio. Furthermore, the first semiconductor layers 401 may include different compositions among them, and the second semiconductor layers 402 may include different compositions among them. Either of the semiconductor layers 401 and 402 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 401 and 402 may be chosen based on providing differing oxidation rates and/or etch selectivity.

The semiconductor layers 401 and 402 can be epitaxially grown from the semiconductor substrate 302. For example, each of the semiconductor layers 401 and 402 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor substrate 302 extends upwardly, resulting in the semiconductor layers 401 and 402 having the same crystal orientation with the semiconductor substrate 302.

Upon growing the semiconductor layers 401 and 402 on the semiconductor substrate 302 (as a stack), the stack may be patterned to form the fin structures 410A-B and the fin structures 450A-B, as shown in FIG. 4. Each of the fin structures is elongated along a lateral direction, and includes a stack of patterned semiconductor layers 401-402 interleaved with each other. The fin structures 410A-B and 450A-B are formed by patterning the stack of semiconductor layers 401-402 and the semiconductor substrate 302 using, for example, photolithography and etching techniques.

For example, a mask layer (which can include multiple layers such as, for example, a pad oxide layer and an overlying hardmask layer 460) is formed over the topmost semiconductor layer of the stack (e.g., 402 in FIG. 4). The pad oxide layer may be a thin film comprising silicon oxide formed, for example, using a thermal oxidation process. The pad oxide layer may act as an adhesion layer between the topmost semiconductor layer 402 and the hardmask layer 460. In some embodiments, the hardmask layer 460 may include a dielectric material such as, for example, silicon nitride, silicon oxynitride, silicon carbonitride, the like, or combinations thereof. In some other embodiments, the hardmask layer 460 may include a semiconductor material similar as a material of the semiconductor layers 401/402 such as, for example, $Si_{1-y}Ge_y$, Si, etc., in which the molar ratio (y) may be different from or similar to the molar ratio (x) of the semiconductor layers 401. The hardmask layer 460 may be formed over the stack (i.e., before pattering the semiconductor layers 401 and 402) using low-pressure chemical vapor deposition (LPCVD) or plasma enhanced chemical vapor deposition (PECVD), for example.

The mask layer 460 may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask.

WA The patterned mask 460 can be subsequently used to pattern exposed portions of the semiconductor layers 401-402 and the substrate 302 to form the fin structures 410A-B in the area 310 and the fin structures 450A-B in the area 350, respectively, thereby defining trenches (or openings) between adjacent fin structures. When multiple fin structures are formed, such a trench may be disposed between any adjacent ones of the fin structures. The fin structures 410A-B formed in the low density area 310 may separate from each other with a distance, $D_1$, and the fin structures 450A-B formed in the high density area 350 may separate from each other with a distance, $D_2$, wherein $D_1$ is greater than $D_2$. In a non-limiting example, the distance $D_1$ may range between about 5 nm and about 50 nm, and the distance $D_2$ may range between about 1 nm and about 50 nm. In some embodiments, the fin structures 410A-B and 450A-B are formed by etching trenches in the semiconductor layers 401-402 and substrate 302 using, for example, reactive ion etch (RIE), neutral beam etch (NBE), the like, or combinations thereof. The etch may be anisotropic. In some embodiments, the trenches may be strips (when viewed from the top) parallel to each other, and closely spaced with respect to each other. In some embodiments, the trenches may be continuous and surround the respective fin structures.

Figure 5:
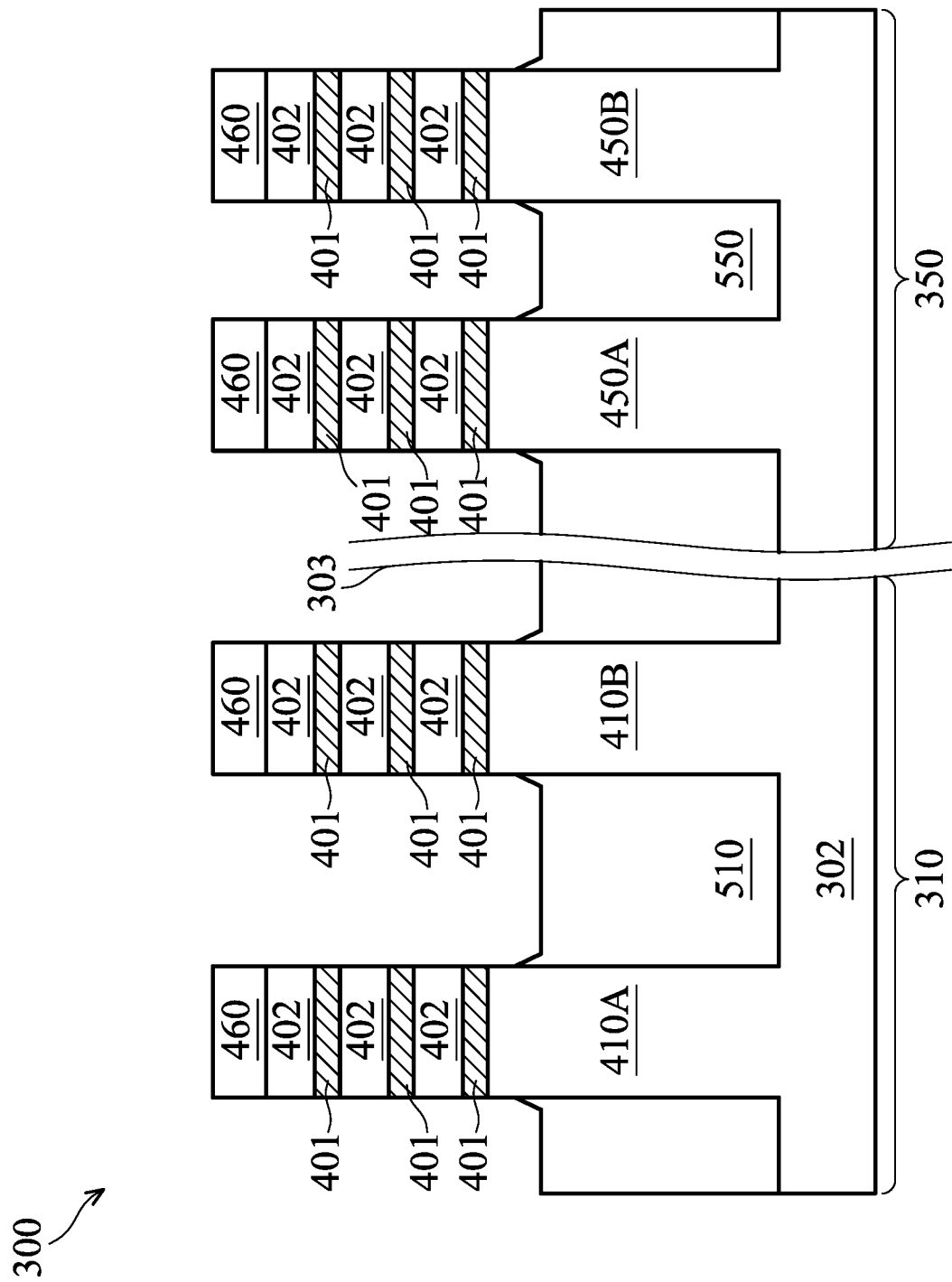

Corresponding to operation 206 of FIG. 2, FIG. 5 is a cross-sectional view of the GAA FET device 300 including one or more isolation structures 510 in the area 310 and one or more isolation structures 550 in the area 350, at one of the various stages of fabrication. The cross-sectional view of FIG. 5 is cut in a direction along the lengthwise direction of an active/dummy gate structure of the GAA FET device 300 (e.g., cross-section A-A indicated in FIG. 1).

To form the isolation structures 510 and 550, an insulation material may be universally deposited over the workpiece, which includes the fin structures 410A-B and 450A-B. For example, the insulation material may overlay the fin structures 410A-B and 450A-B by extending along their respective sidewalls and overlaying their respective top surfaces. In some embodiments, the insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP) process, may remove any excess insulation material and form a top surface of the insulation material and a top surface of a patterned mask (not shown) defining the fin structures 410A-B and 450A-B. The patterned mask 460 may also be removed by the planarization process, in some embodiments.

Next, the insulation material is recessed to form the isolation structure 510 in the area 310 and isolation structure 550 in the area 350, as shown in FIG. 5. The isolation structures 510 and 550 are sometimes referred to as shallow trench isolation (STI) 510 and 550, respectively. The isolation structures 510 and 550 are recessed such that (respective upper portions of) the fin structures 410A-B and 450A-B each protrude from between neighboring portions of the isolation structures 510 and 550. Alternatively stated, the isolation structure 510 can embed respective lower portions of the fin structures 410A-B, and the isolation structure 550 can embed respective lower portions of the fin structures 450A-B. The top surface of the isolation structures (STIs) 510 and 550 may have a flat surface (as illustrated), a convex surface, a concave surface (such as dishing), or combinations thereof. The top surface of the isolation structures 510 and 550 may be formed flat, convex, and/or concave by an appropriate etch. The isolation structures 510 and 550 may be recessed using an acceptable etching process, such as one that is selective to the insulation material of the isolation structures 510 and 550. For example, a dry etch or a wet etch using dilute hydrofluoric (DHF) acid may be performed to form the isolation structures 510 and 550.

Figure 6:
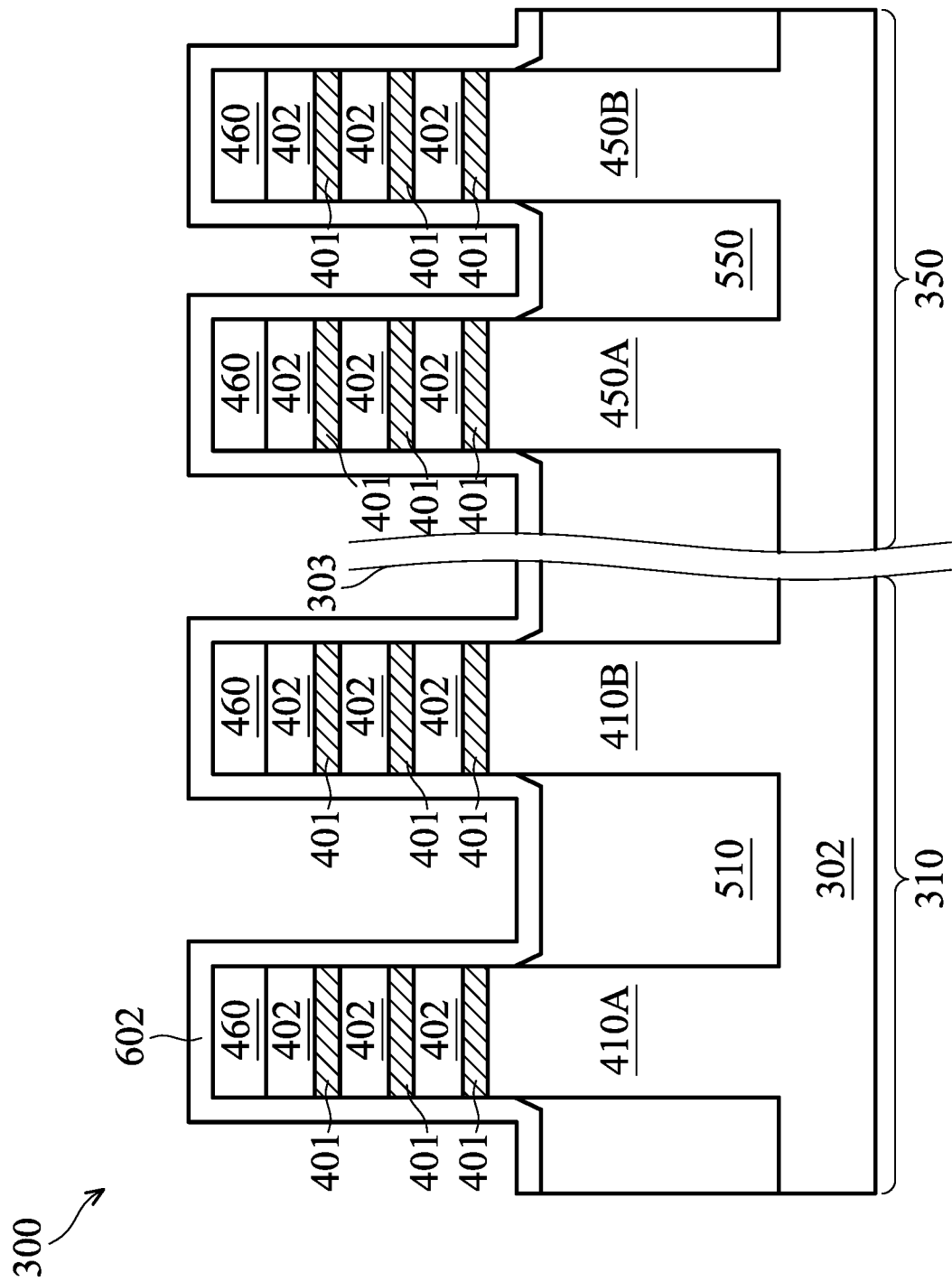

Corresponding to operation 208 of FIG. 2, FIG. 6 is a cross-sectional view of the GAA FET device 300 including a cladding layer 602 universally formed over the fin structures 410A-B in the area 310 and the fin structures 450A-B in the area 350, at one of the various stages of fabrication. The cross-sectional view of FIG. 6 is cut in a direction along the lengthwise direction of an active/dummy gate structure of the GAA FET device 300 (e.g., cross-section A-A indicated in FIG. 1).

As shown, the cladding layer 602 is (e.g., conformally) formed over the workpiece to overlay the respective exposed (e.g., protruded) portions of the fin structures 410A-B and 450A-B. Specifically, the cladding layer 602 can overlay a top surface of the patterned mask 460 and extend along sidewalls of each of the protruded fin structures 410A-B and 450A-B. Further, the cladding layer 602 can overlay the top surface of the isolation structures 510 and 550. In various embodiments, the cladding layer 602 may include a semiconductor material similar as a material of the semiconductor layers 401/402 such as, for example, $Si_{1-z}Ge_z$, Si, etc., in which the molar ratio (z) may be different from or similar to the molar ratio (x) of the semiconductor layers 401. The cladding layer 602 may be formed using molecular beam deposition (MBD), atomic layer deposition (ALD), PECVD, and the like, for example.

Figure 7A:
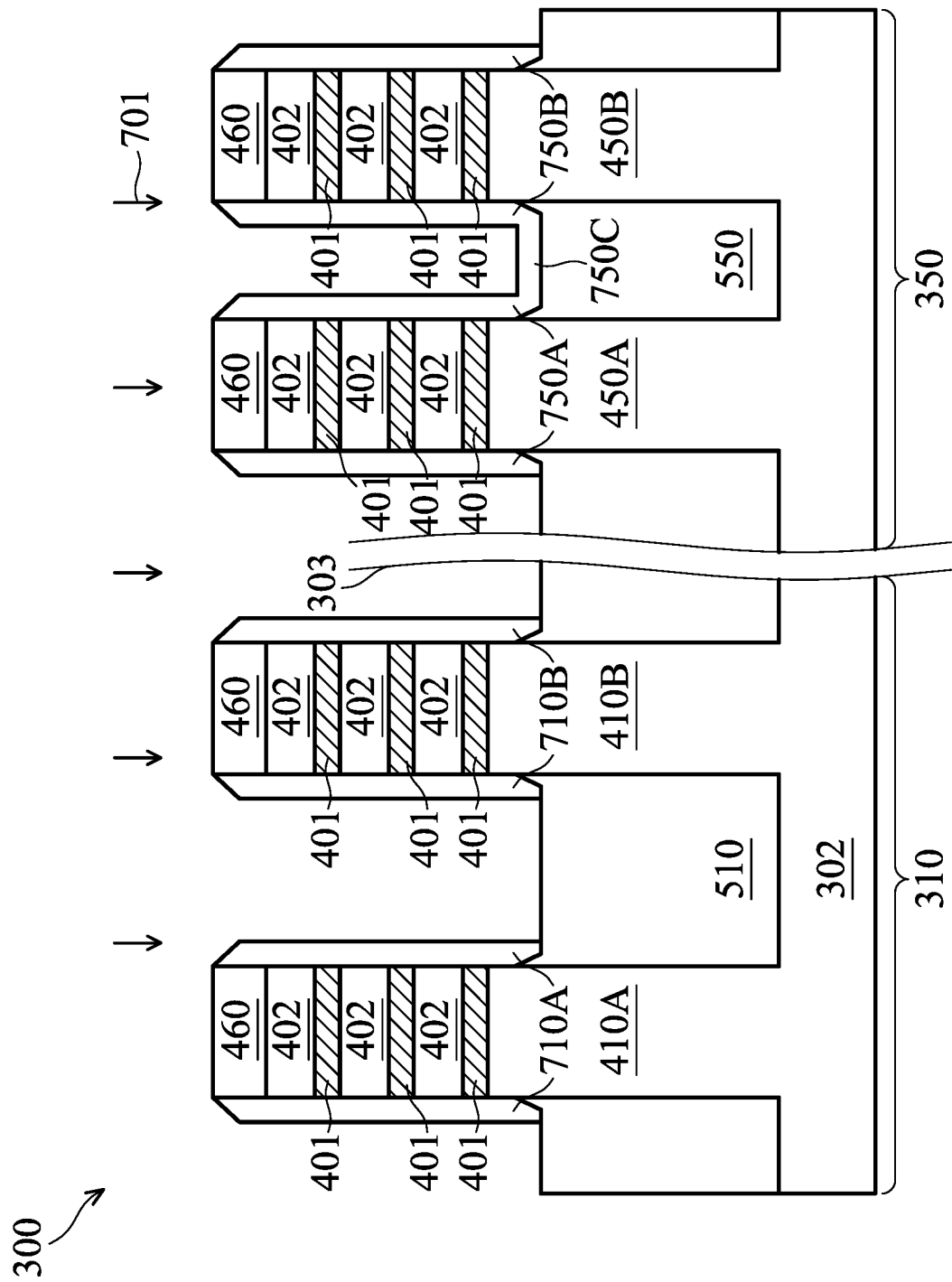
Figure 7B:
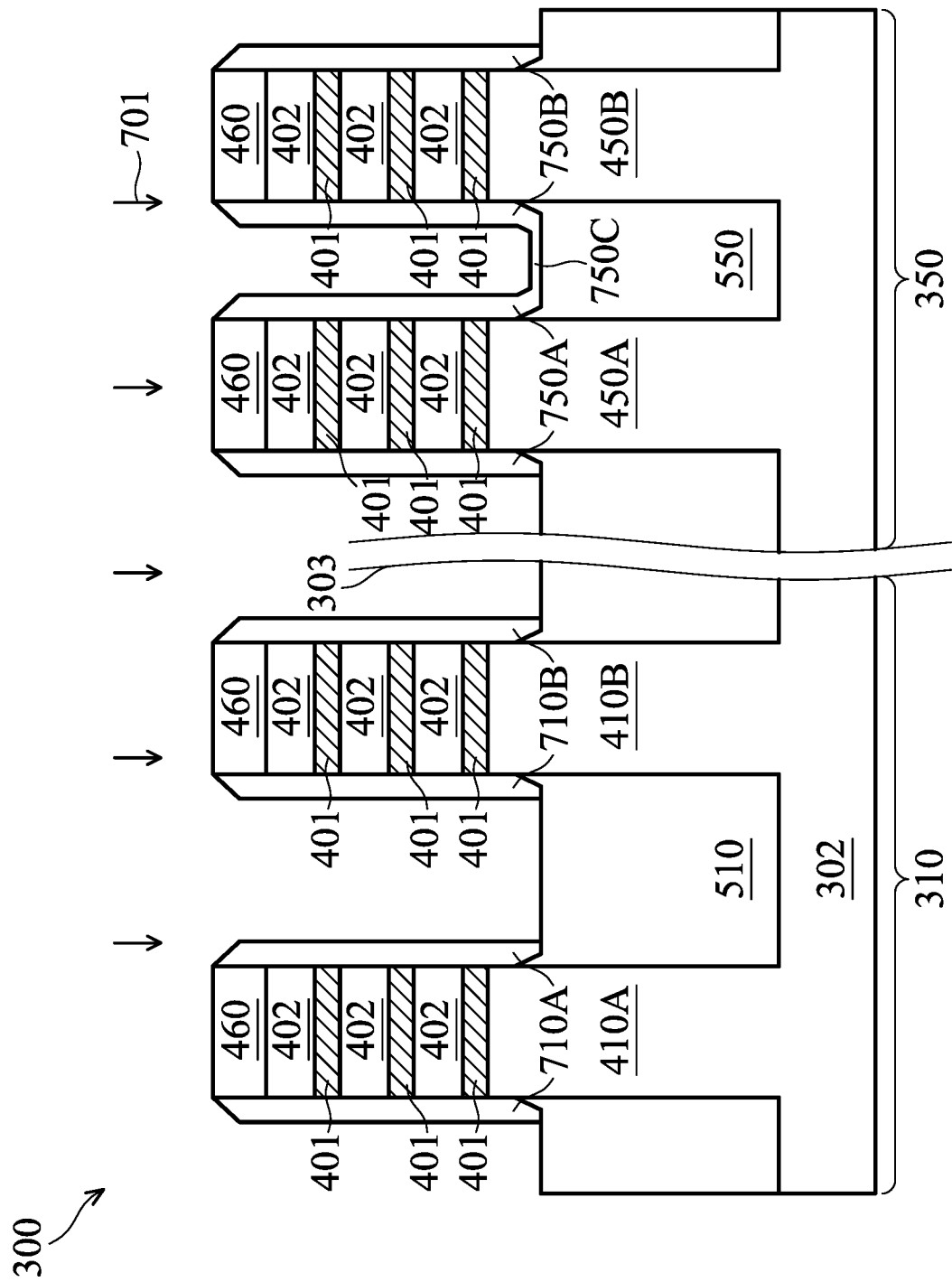

Corresponding to operation 210 of FIG. 2, FIGS. 7A and 7B are cross-sectional views of the GAA FET device 300 in which the cladding layer 602 (FIG. 6) is patterned, at one of the various stages of fabrication. FIGS. 7A and 7B illustrate examples in which the patterned cladding layer 602 have respective different profiles between the fin structures 450A and 450B in the high density area 350. The cross-sectional view of FIGS. 7A-B are each cut in a direction along the lengthwise direction of an active/dummy gate structure of the GAA FET device 300 (e.g., cross-section A-A indicated in FIG. 1).

In various embodiments, the cladding layer 602 is patterned via an etching process 701 to remove a number of laterally extending portions of the cladding layer 602 in the area 310 and a number of laterally extending portions of the cladding layer 602 in the area 350. Specifically, in the area 310, the portions laterally extending along the hardmask layers 460 over the fin structures 410A-B and the portions laterally extending along top surface of the isolation structure 510 are removed. In the area 350, the portions laterally extending along the hardmask layers 460 over the fin structures 450A-B and the portions laterally extending along top surface of the isolation structure 550, except for the portion that laterally extend between the fins structures 450A-B, are removed.

As such, portions of the cladding layer 602 remain extending along the sidewall of the fin structure 410A (hereinafter "cladding portion 710A"), portions of the cladding layer 602 remain extending along the sidewall of the fin structure 410B (hereinafter "cladding portion 710B"), portions of the cladding layer 602 remain extending along the sidewall of the fin structure 450A (hereinafter "cladding portion 750A"), portions of the cladding layer 602 remain extending along the sidewall of the fin structure 450B (hereinafter "cladding portion 750B"), and a portion of the cladding layer 602 remains (hereinafter "cladding portion 750C"), as shown in FIGS. 7A-B. Further, the cladding portion 750C, laterally extending along the top surface of the isolation structure 550, can connect the cladding portions 750A and 750B. Such a cladding portion 750C can allow different portions of an active gate structure that respectively wrap around different stacks of channel layers to connect to each other, which will be discussed in further detail below.

In the illustrated example of FIG. 7A, the etching process 701 may barely etch the cladding layer 602 between the fin structures 450A and 450B, such that the cladding portion 750C may present a substantially uniform thickness (or height) along a lateral extension direction of the cladding portion 750C. In the illustrated example of FIG. 7B, the etching process 701 may etch a portion of the cladding layer 602 between the fin structures 450A and 450B, such that the cladding portion 750C may present a minimum thickness (or height) about at its center and a maximum thickness (or height) about at its end along the lateral extension direction of the cladding portion 750C.

The etching process 701 can include a plasma etching process. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3^+$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with gases such as argon (Ar), helium (He), neon (Ne), and other suitable dilutive gases and combinations thereof to control the etching rates. As a non-limiting example, a source power of 10 watts to 3000 watts, a bias power of 0 watts to 3000 watts, a pressure of 1 millitorr to 5 torr, and an etch gas flow of 0 standard cubic centimeters per minute to 5000 standard cubic centimeters per minute may be used in the etching process. However, it is noted that source powers, bias powers, pressures, and flow rates outside of these ranges are also contemplated.

In another example, the etching process 701 can include a wet etching process, in combination with the plasma etching process. In such a wet etching process, a main etch chemical such as hydrofluoric acid (HF), fluorine ($F_2$), and other suitable main etch chemicals and combinations thereof can be used with assistive etch chemicals such as sulfuric acid ($H_2SO_4$), hydrogen chloride (HCl), hydrogen bromide (HBr), ammonia ($NH_3$), phosphoric acid ($H_3PO_4$), and other suitable assistive etch chemicals and combinations thereof as well as solvents such as deionized water, alcohol, acetone, and other suitable solvents and combinations thereof.

In accordance with various embodiments, the cladding portion 750C may remain by limiting an etching amount of the etching process 701 applied on the cladding layer 602 between the fin structures 450A and 450B, which are spaced apart with a relatively small distance (e.g., less than about 50 nm). The etching amount can be limited in such a relatively narrow area by various techniques. For example, the bias power of the etching process 701 may be reduced so as to reduce an amount of the ions that can (e.g., directionally or otherwise anisotropically) reach the cladding portion 750C. In another example, the pressure of the etching process 701 may be increased so as to reduce an amount of the ions and/or radicals generated. Accordingly, an amount of the ions/radicals that can (e.g., directionally or otherwise anisotropically) reach the cladding portion 750C may be reduced. In yet another example, an amount of the passivation gas may be increased to resist against the etching on the cladding portion 750C. In yet another example, a mask layer may be formed over the area 350, e.g., overlaying the cladding portion 750C, so as to keep the cladding portion 750C substantially intact (e.g., the example shown in FIG. 7A).

Figure 8A:
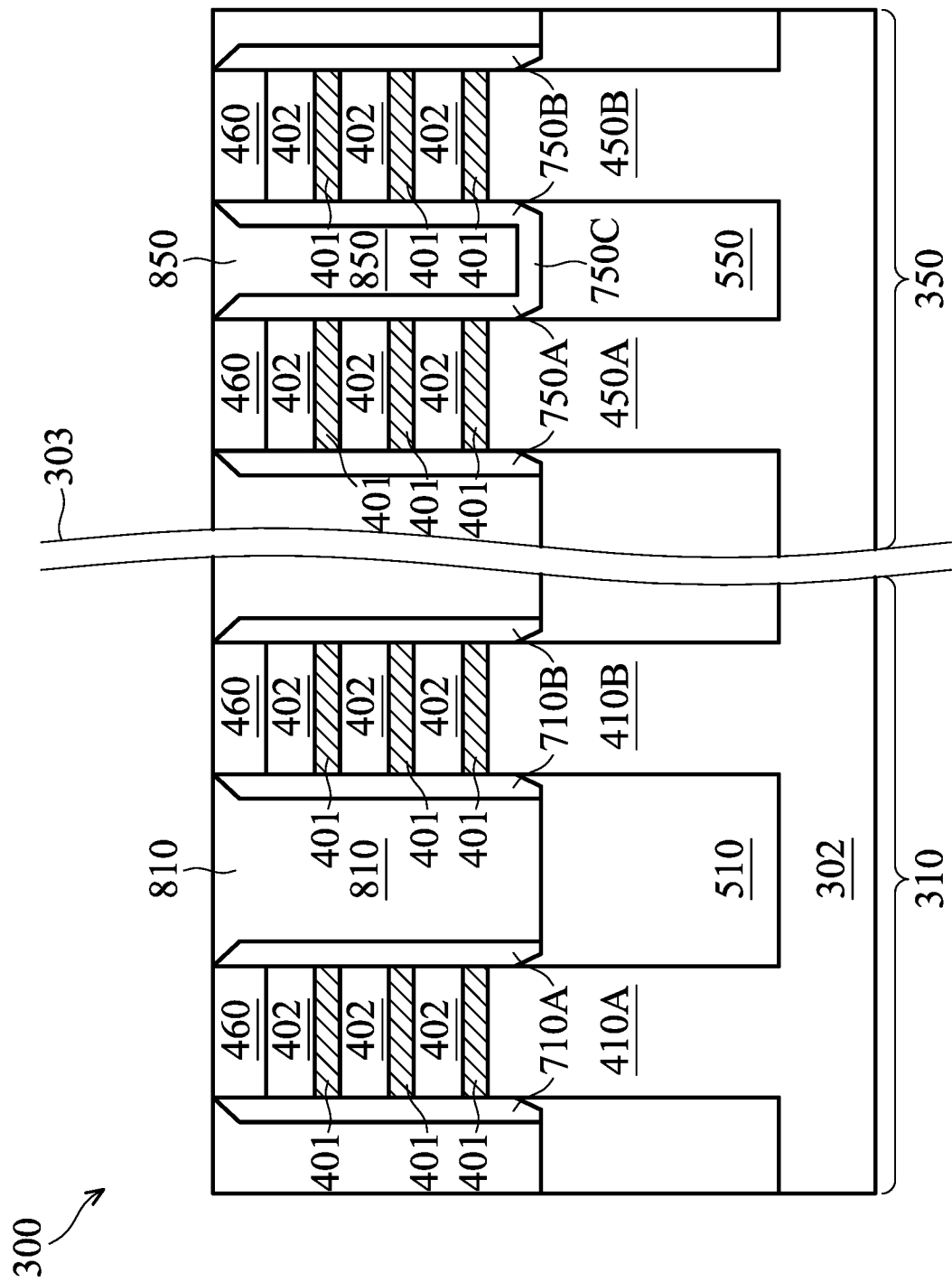
Figure 8B:
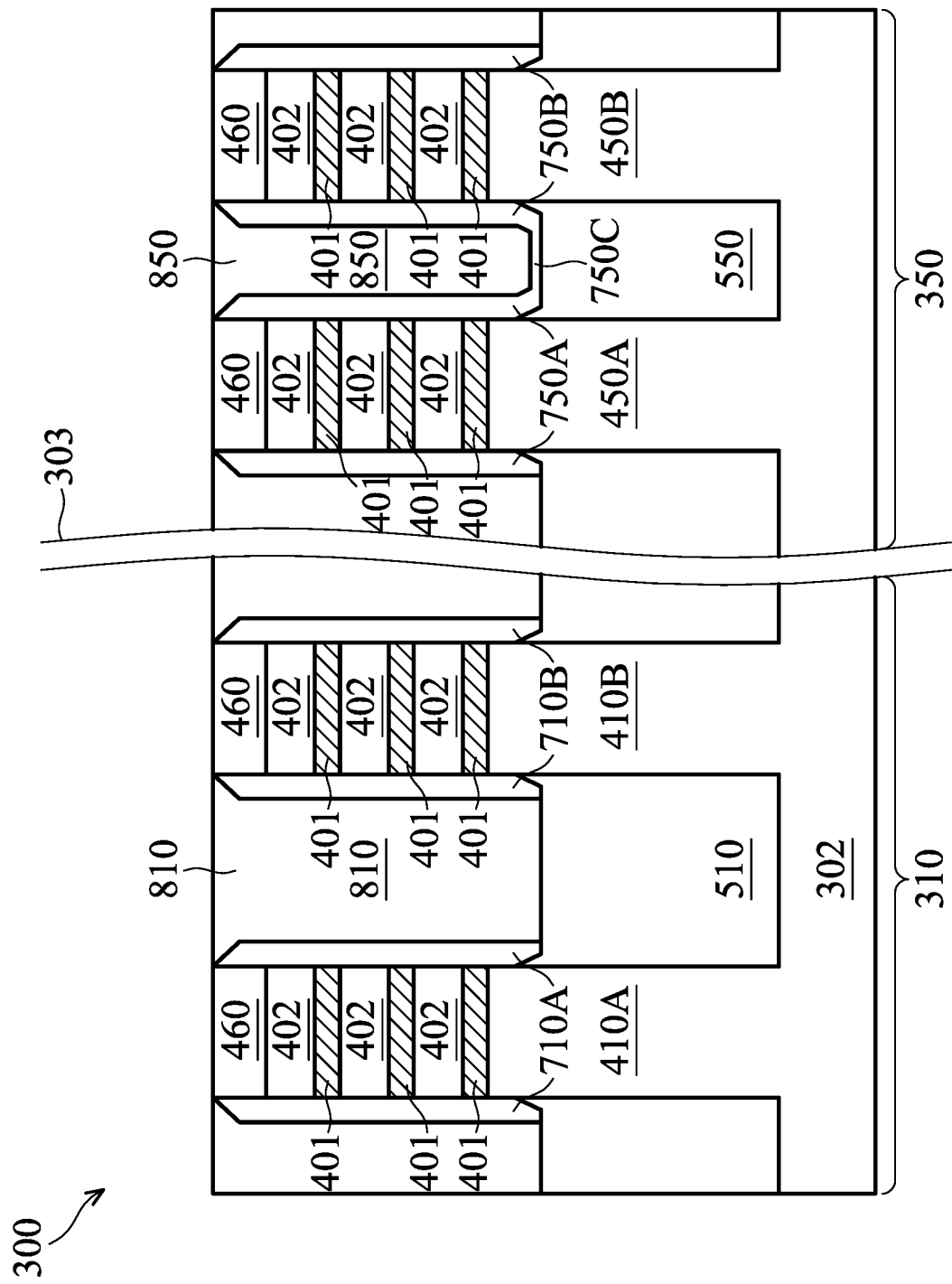

Corresponding to operation 212 of FIG. 2, FIGS. 8A and 8B are cross-sectional views of the GAA FET device 300 including a dummy fin structure 810 in the area 310 and a dummy fin structure 860 in the area 350, at one of the various stages of fabrication. The cross-sectional view of FIGS. 8A-B are each cut in a direction along the lengthwise direction of an active/dummy gate structure of the GAA FET device 300 (e.g., cross-section A-A indicated in FIG. 1). The illustrated example of FIG. 8A is formed based on the GAA FET device 300 shown in FIG. 7A; and the illustrated example of FIG. 8B is formed based on the GAA FET device 300 shown in FIG. 7B.

The dummy fin structures 810 and 850 may be formed using low-pressure chemical vapor deposition (LPCVD) or plasma enhanced chemical vapor deposition (PECVD), for example, to fill the spacing between adjacent fin structures (e.g., between fin structures 410A and 410B, between fin structures 450A and 450B, etc.) with a dielectric material. As such, the dummy fin structures 810 and 850 may have the same lengthwise direction as the fin structures 410A-B and 450A-B. Further, the dummy fin structures 810 and 850 may each be sandwiched (or otherwise disposed) between adjacent fin structures with a number of (e.g., vertically extending) cladding portions disposed therebetween. For example, the dummy fin structure 810 is sandwiched between the fin structures 410A and 410B, with the (vertically extending) cladding portions 710A and 710B disposed therebetween. In addition to being sandwiched between the fin structures 450A and 450B with the (vertically extending) cladding portions 750A and 750B, the dummy fin structure 850 is separated from the STI 550 with a (e.g., laterally extending) cladding portion 750C.

Although the dummy fin structures 810 and 850 each fill the spacing between adjacent fin structures in the illustrated examples of FIGS. 8A-B, it should be understood that a spacing may remain between the dummy fin structure and an adjacent fin structure, while remaining within the scope of the present disclosure. For example, the dummy fin structures 810 and 850 may each be formed by patterning the dielectric material using, for example, photolithography and etching techniques. As such, while the vertically extending cladding portion still disposed along the sidewalls of the fin structure, a spacing may be present between the vertically extending cladding portion and the dummy fin structure.

In some embodiments, the dielectric material of the dummy fin structures 810 and 850 may include silicon oxide, silicon nitride, silicon oxynitride, silicon carbide, silicon carbonitride, silicon oxycarbonitride, silicon oxycarbide, or combinations thereof. In another example, the dielectric material may include group IV-based oxide or group IV-based nitride, e.g., tantalum nitride, tantalum oxide, hafnium oxide, or combinations thereof.

Figure 9A:
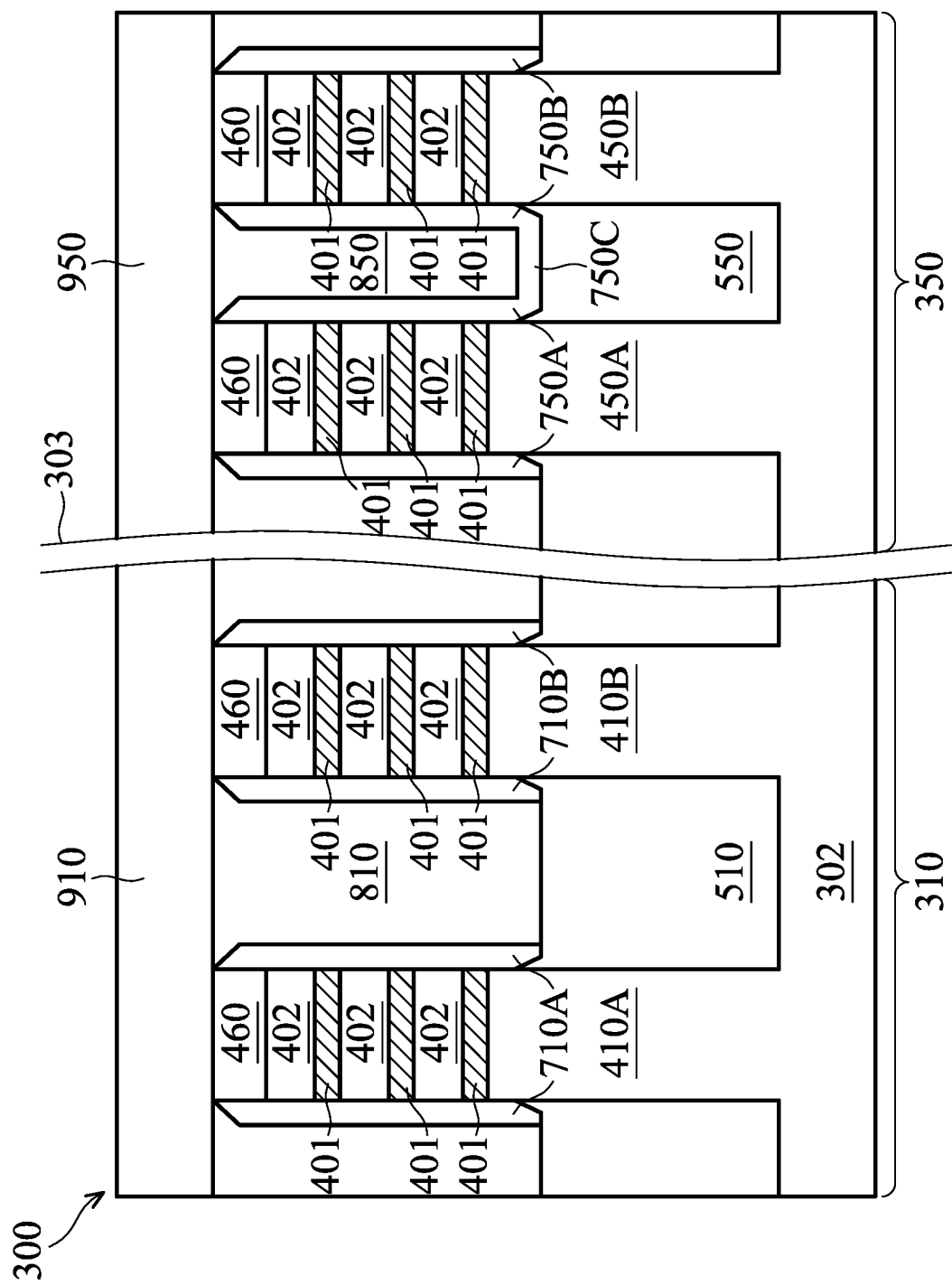
Figure 9B:
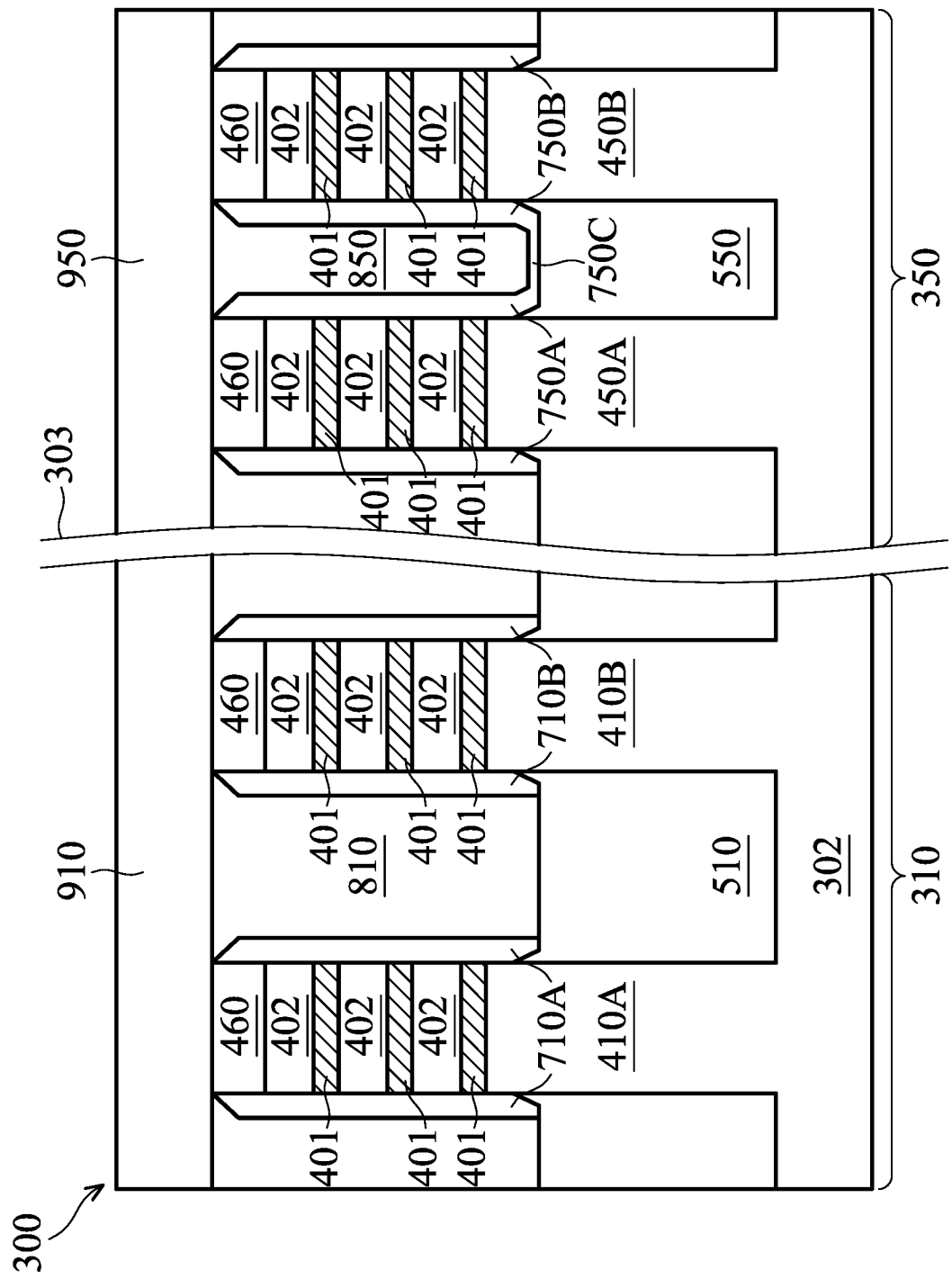

Corresponding to operation 214 of FIG. 2, FIG. 9A is a cross-sectional view of the GAA FET device 300 including a dummy gate structure 910 in the area 310 and a dummy gate structure 950 in the area 350, at one of the various stages of fabrication. The cross-sectional view of FIGS. 9A-B are each cut in a direction along the lengthwise direction of an active/dummy gate structure of the GAA FET device 300 (e.g., cross-section A-A indicated in FIG. 1). The illustrated example of FIG. 9A is formed based on the GAA FET device 300 shown in FIG. 8A; and the illustrated example of FIG. 9B is formed based on the GAA FET device 300 shown in FIG. 8B.

The dummy gate structures 910 and 950 may have a lengthwise direction (e.g., along direction A-A in FIG. 1) perpendicular to the lengthwise direction of the fin structures. As such, the dummy gate structure 910 may be formed to overlay (e.g., straddle) a portion of each of the fin structures 410A-B in the area 310. Prior to, concurrently with, or subsequently to forming the dummy gate structure 910 in the area 310, a dummy gate structure 950 can be formed in the area 350 to overlay (e.g., straddle) a portion of each of the fin structures 450A-B in the area 350. For example, the dummy gate structure 910 may straddle central portions of the fin structures 410A and 410B, respectively, such that respective end or side portions of the fin structures 410A and 410B are exposed. Similarly, the dummy gate structure 950 may straddle central portions of the fin structures 450A and 450B, respectively, with respective end or side portions of the fin structures 450A and 450B exposed.

The dummy gate structures 910 and 950 may each include a dummy gate dielectric and a dummy gate, which are not shown separately for purpose of clarity. To form the dummy gate structures 910 and 950, a dielectric layer may be formed over the workpiece (shown in FIGS. 8A-B). The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown. Next, a gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like. After the layers (e.g., the dielectric layer, the gate layer, and the mask layer) are formed, the mask layer may be patterned using suitable lithography and etching techniques. Next, the pattern of the mask layer may be transferred to the gate layer and the dielectric layer by a suitable etching technique to form the dummy gate structures 910 and 950, respectively.

Upon forming the dummy gate structures 910 and 950, gate spacers (e.g., 109 in FIG. 1) may be formed on opposing sidewalls of the dummy gate structures 910 and 950, respectively (along a direction perpendicular to cross-section A-A of FIG. 1). The gate spacers may each be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacers. The formation methods of the gate spacers, as described above, are merely non-limiting examples, and other formation methods are possible. These and other variations are fully intended to be included within the scope of the present disclosure.

Upon forming the gate spacers, end portions (or portions that are not overlaid by the dummy gate structures) of the semiconductor layers (e.g., 401 as shown in FIG. 4) of the fin structures 410A-B and 450A-B (along a direction perpendicular to cross-section A-A of FIG. 1) can be removed (e.g., etched) using a "pull-back" process. As such, the semiconductor layers 401 of the fin structures 410A-B and 450A-B can each be pulled back by a pull-back distance. In an example where the semiconductor layers 402 include Si, and the semiconductor layers 401 include SiGe, the pull-back process may include a hydrogen chloride (HCl) gas isotropic etch process, which etches SiGe without attacking Si. The Si layers (nanostructures) 402 may remain intact during this process. Consequently, a pair of recesses can be formed on the ends of each semiconductor layer 401, with respect to the neighboring semiconductor layers 402.

Next, such recesses along the ends of each semiconductor layer 401 can be filled with a dielectric material to form inner spacers (not shown). The dielectric material for the inner spacers may include silicon nitride, silicoboron carbonitride, silicon carbonitride, silicon carbon oxynitride, or any other type of dielectric material (e.g., a dielectric material having a dielectric constant k of less than about 5) appropriate to the role of forming an insulating gate sidewall spacers of transistors.

Upon forming the inner spacers, source/drain structures (not shown) are formed on the opposite sides of each of the fin structures 410A-B and 450A-B (along a direction perpendicular to cross-section A-A of FIG. 1) to couple to the semiconductor layers 402 of the fin structures, and separate from the semiconductor layers 401 of the fin structures with the inner spacer disposed therebetween. The source/drain structures are formed by epitaxially growing a semiconductor material from the semiconductor layers 402 of the fin structures, using suitable methods such as metal-organic CVD (MOCVD), molecular beam epitaxy (MBE), liquid phase epitaxy (LPE), vapor phase epitaxy (VPE), selective epitaxial growth (SEG), the like, or combinations thereof.

Upon forming the source/drain structures, an interlayer dielectric (ILD) (not shown) may be formed to overlay the source/drain structures. The ILD is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD is formed, a planarization process, such as a CMP process, may be performed to achieve a level top surface for the ILD. After the planarization process, the top surface of the ILD is level with the top surface of the dummy gate structures 910 and 950, in some embodiments.

Figure 10A:
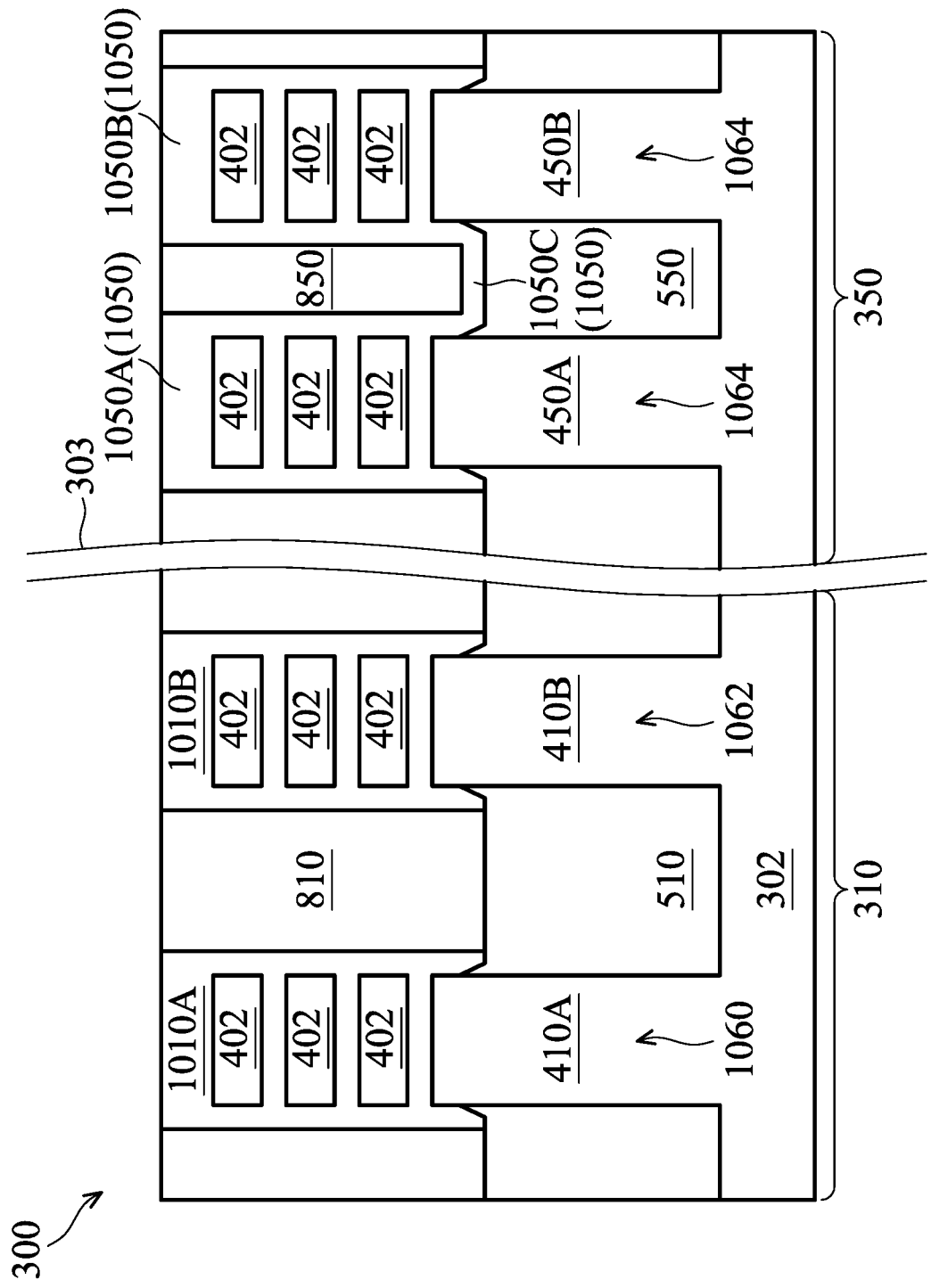
Figure 10B:
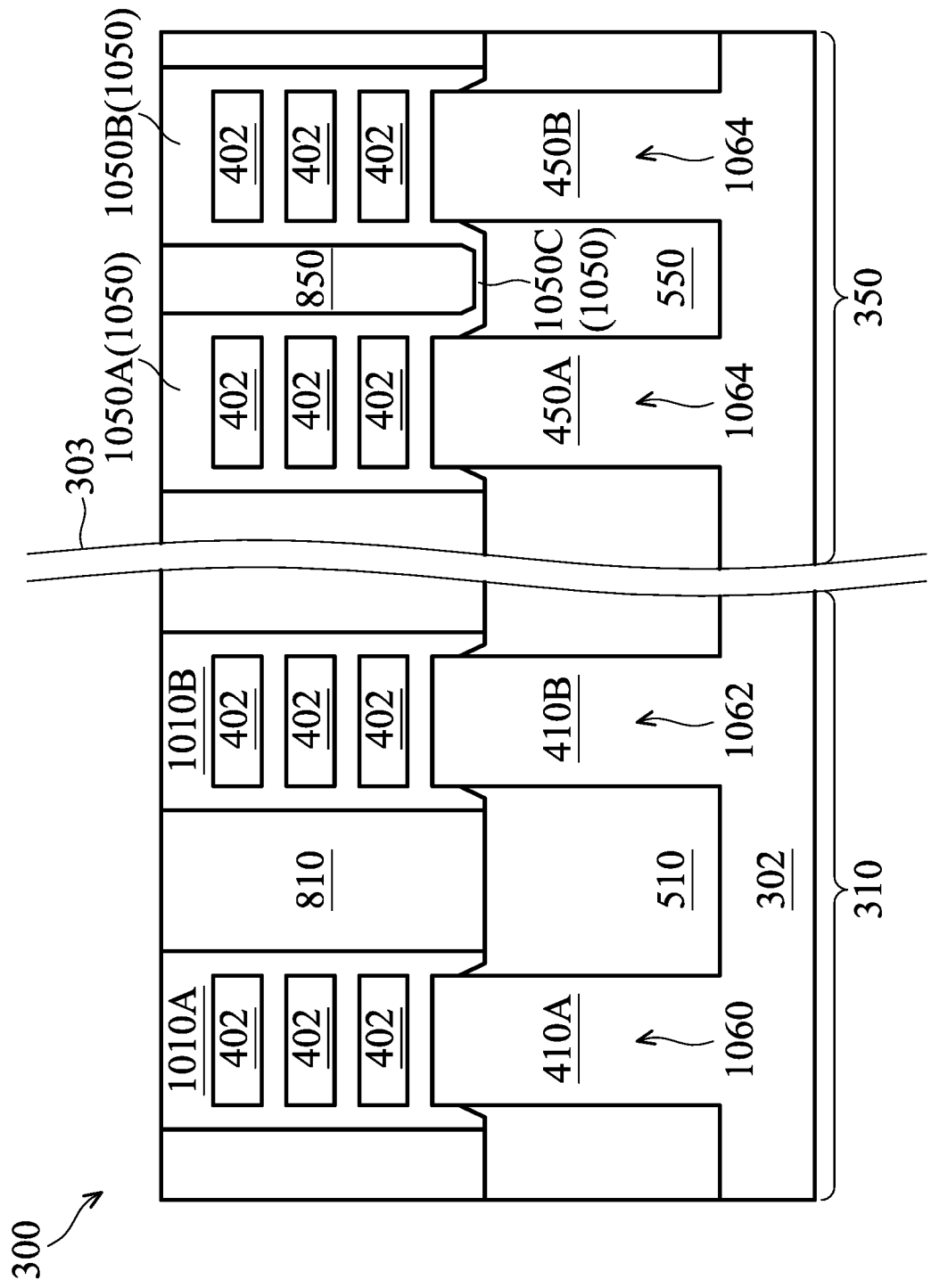

Corresponding to operation 216 of FIG. 2, FIG. 10A is a cross-sectional view of the GAA FET device 300 including active (e.g., metal) gate structures 1010A and 1010B in the area 310 and an active (e.g., metal) gate structure 1050 in the area 350, at one of the various stages of fabrication. The cross-sectional view of FIGS. 10A-B are each cut in a direction along the lengthwise direction of an active/dummy gate structure of the GAA FET device 300 (e.g., cross-section A-A indicated in FIG. 1). The illustrated example of FIG. 10A is formed based on the GAA FET device 300 shown in FIG. 9A; and the illustrated example of FIG. 10B is formed based on the GAA FET device 300 shown in FIG. 9B.

Upon forming the ILD overlaying the source/drain structures, the dummy gate structures may be replaced with the active gate structures 1010A, 1010B, and 1050, respectively. Specifically, the active gate structures 1010A is formed by replacing the dummy gate structure 910, the hard mask layer 460 (if still remains), the cladding portion 710A (FIGS. 9A-B), and the semiconductor layers 401 of the fin structure 410A (FIGS. 9A-B), with a gate dielectric and a gate metal (which will be discussed in detail below). Similarly, the active gate structures 1010B is formed by replacing the dummy gate structure 910, the hard mask layer 460 (if still remains), the cladding portion 710B (FIGS. 9A-B), and the semiconductor layers 401 of the fin structure 410B (FIGS. 9A-B), with a gate dielectric and a gate metal; and the active gate structures 1050 is formed by replacing the dummy gate structure 950, the hard mask layer 460 (if still remains), the cladding portions 750A-C (FIGS. 9A-B), and the semiconductor layers 401 of the fin structures 450A-B (FIGS. 9A-B), with a gate dielectric and a gate metal.

As such, the active gate structure 1010A can wrap around each of the semiconductor layers 402 of the fin structure 410A; the active gate structure 1010B can wrap around each of the semiconductor layers 402 of the fin structure 410B; and the active gate structure 1050 can include a wrapping portion 1050A that wraps around each of the semiconductor layers 402 of the fin structure 450A, and a wrapping portion 1050B that wraps around each of the semiconductor layers 402 of the fin structure 450B, as shown in FIGS. 10A-B. Following such a gate replacement process, a CMP process may be performed to planarized respective upper portions of the active gate structures 1010A-B and 1050.

Consequently, in the area 310, as no laterally extending cladding portion exists between the fin structures 410A and 410B (referring again to FIGS. 9A-B), the active gate structures 1010A and 1010B may separate from each other with the dummy fin structure 810, and in the area 350, the laterally extending cladding portion 750C exists between the fin structures 450A and 450B (referring again to FIGS. 9A-B), the wrapping portions 1050A and 1050B may connect to each other with a connecting portion 1050C of the active gate structure 1050 that replaces the cladding portion 750C. In various embodiments, the connecting portion 1050C can inherit the dimensions and profiles of the cladding portion 750C. For example in FIG. 10A, the connecting portion 1050C can be characterized with a uniform thickness (or height); and for example in FIG. 10B, the connecting portion 1050C can be characterized with a minimum thickness (or height) about at its center and a maximum thickness (or height) about at its end.

The gate dielectric may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric may include a stack of multiple high-k dielectric materials. The gate dielectric can be deposited using any suitable method, including, for example, molecular beam deposition (MBD), atomic layer deposition (ALD), PECVD, and the like. In some embodiments, the gate dielectric may optionally include a substantially thin oxide (e.g., $SiO_x$) layer, which may be a native oxide layer formed on the surface of each of the semiconductor layers 402.

The gate metal may include a stack of multiple metal materials. For example, the gate metal may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), ALD, and/or other suitable process.

Upon forming the active gate structures 1010A-B and 1050, a number of transistors can be defined (or otherwise formed) in the area 310 and area 350, respectively. For example, a transistor 1060 that adopts the active gate structure 1010A wrapping around each of the semiconductor layers 402 of the fin structure 410A can be formed; a second transistor 1062 that adopts the active gate structure 1010B wrapping around each of the semiconductor layers 402 of the fin structure 410B can be formed; and a third transistor 1064 that adopts the active gate structure 1050 wrapping around each of the semiconductor layers 402 of the fin structures 450A-B can be formed. The semiconductor layers 402 of the fin structure 410A can collectively serve as a channel of the transistor 1060; the semiconductor layers 402 of the fin structure 410b can collectively serve as a channel of the transistor 1062; and the semiconductor layers 402 of the fin structure 450A-B can collectively serve as a channel of the transistor 1064. Accordingly, the semiconductor layers 402 may sometimes be referred to as channel layers, and the semiconductor layers 401 (that are replaced with portions of the active gate structures) may sometimes be referred to as sacrificial layers. In some embodiments, the transistors 1060 and 1062, each of which has a single stack of channel layers, may be operated under a relatively lower level of current; and the transistor 1064, which has multiple stacks of channel layers, may be operated under a relatively higher level of current.

Figure 11A:
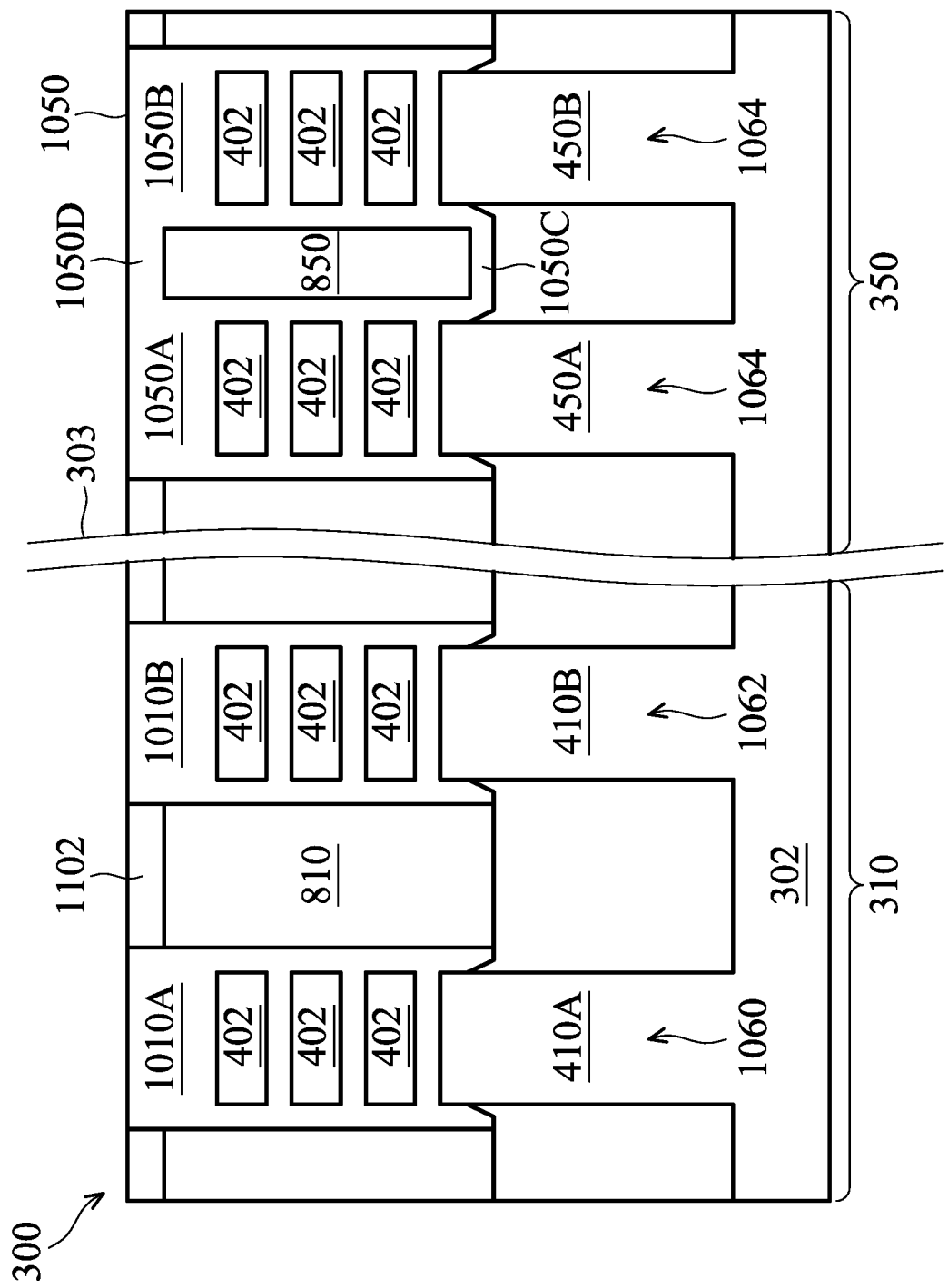
Figure 11B:
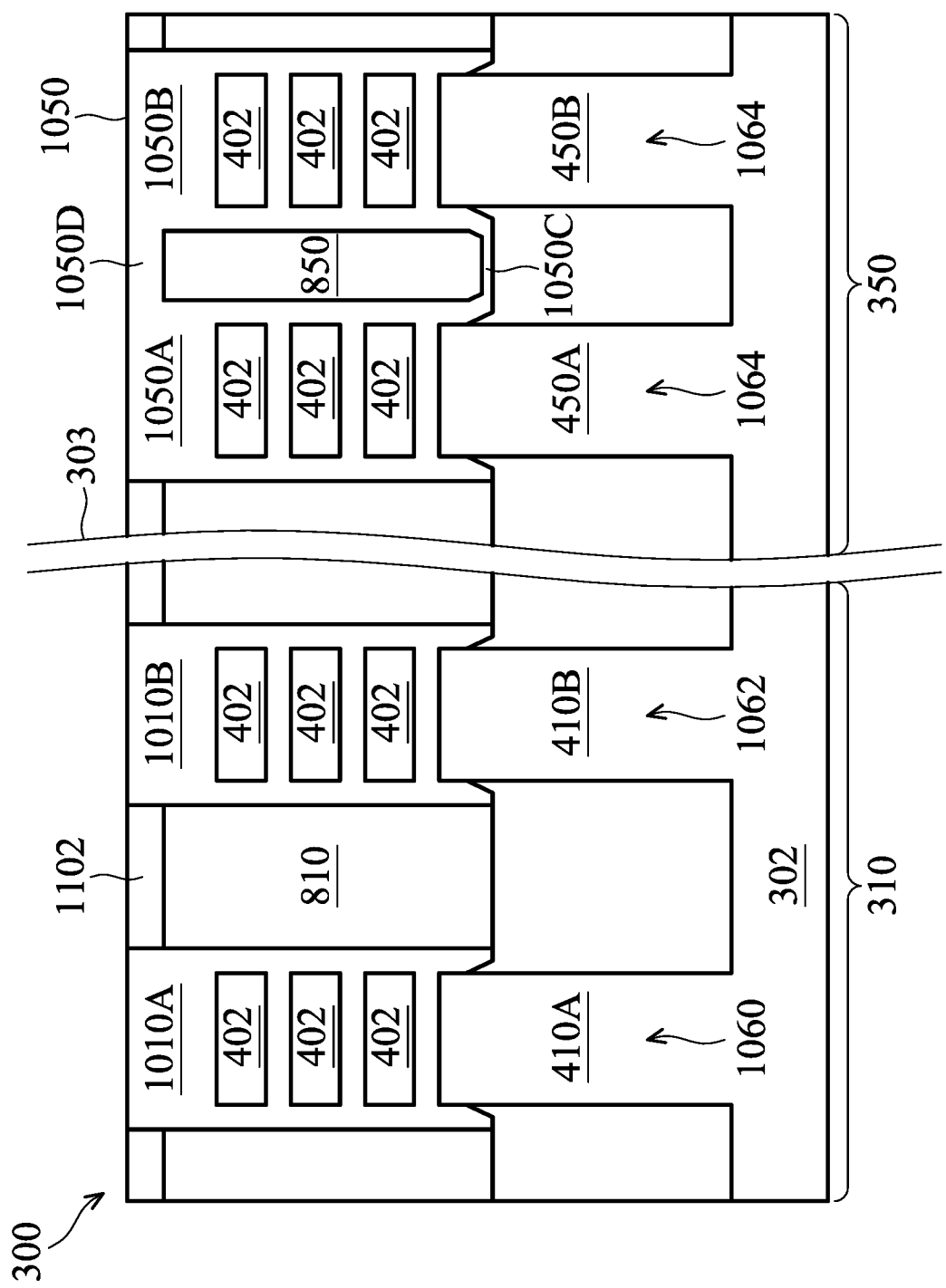

FIGS. 11A and 11B are cross-sectional views of the GAA FET device 300 including the active gate structures 1010A and 1010B in the area 310 and the active gate structure 1050 in the area 350, in alternative or additional embodiments. The cross-sectional view of FIGS. 11A-B are each cut in a direction along the lengthwise direction of an active/dummy gate structure of the GAA FET device 300 (e.g., cross-section A-A indicated in FIG. 1).

As shown, in the area 310, the active gate structures 1010A and 1010B separate from each other further with a gate isolation structure 1102 disposed above the dummy fin structure 810; and in the area 350, the wrapping portions 1050A and 1050B of the active gate structure 1050 connect to each other further with another connecting portion 1050D disposed above the dummy fin structure 850. In the illustrated embodiments of FIGS. 11A-B, the dummy fin structures 810 and 850 may be formed lower than the active gate structures 1010A-B and 1050. As such, upon forming the active gate structures, in the area 350, the connecting portion 1050D has been formed to connect the wrapping portions 1050A and 1050B. On the other hand (in the area 310), upon forming the active gate structures, the active gate structures 1010A and 1010B may connect to each other, which may be "cut" or otherwise disconnected by replacing a portion of the active gate structure above the dummy fin structure 810 with the gate isolation structure 1102, in some embodiments.

Figure 12A:
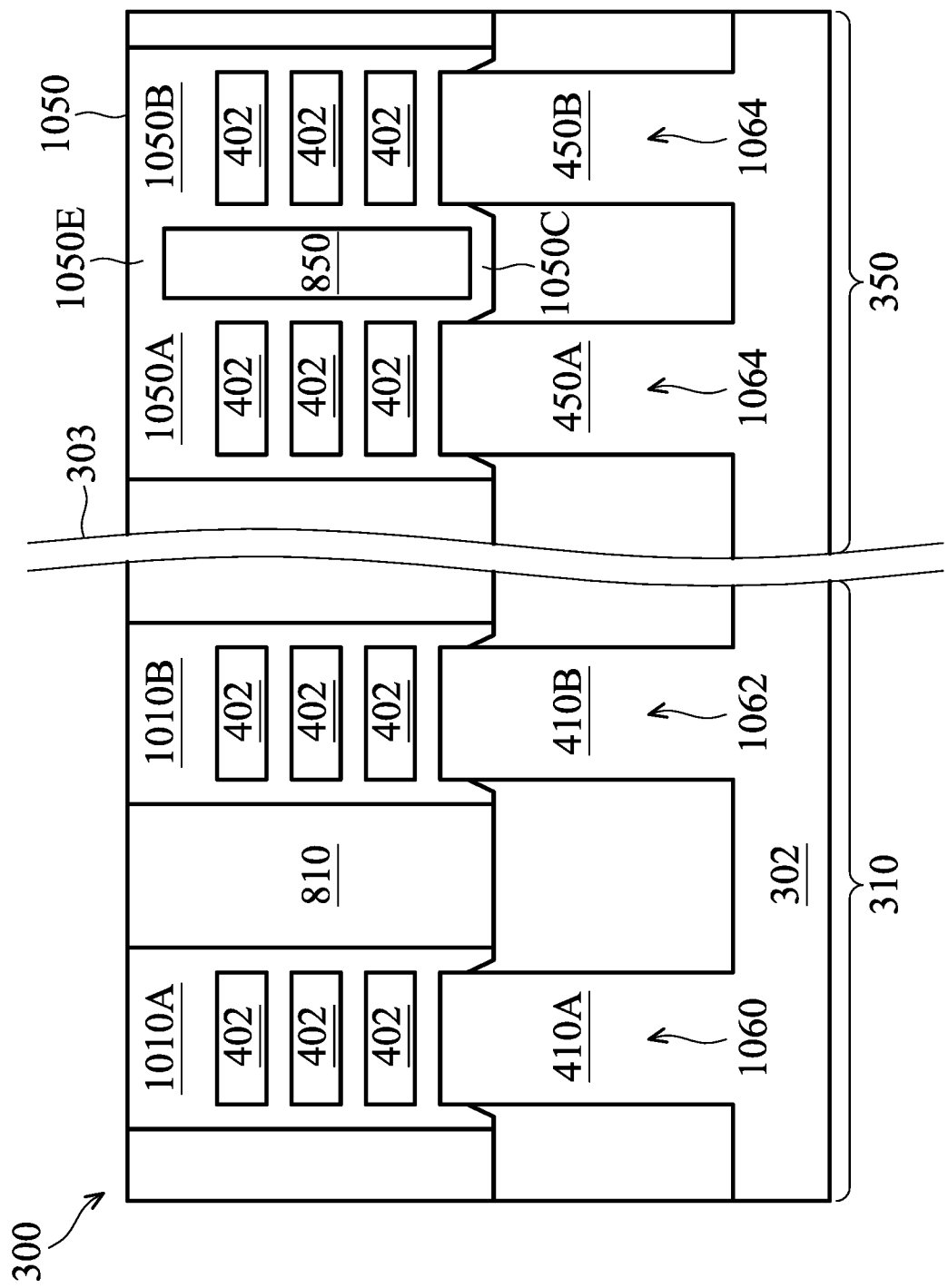
Figure 12B:
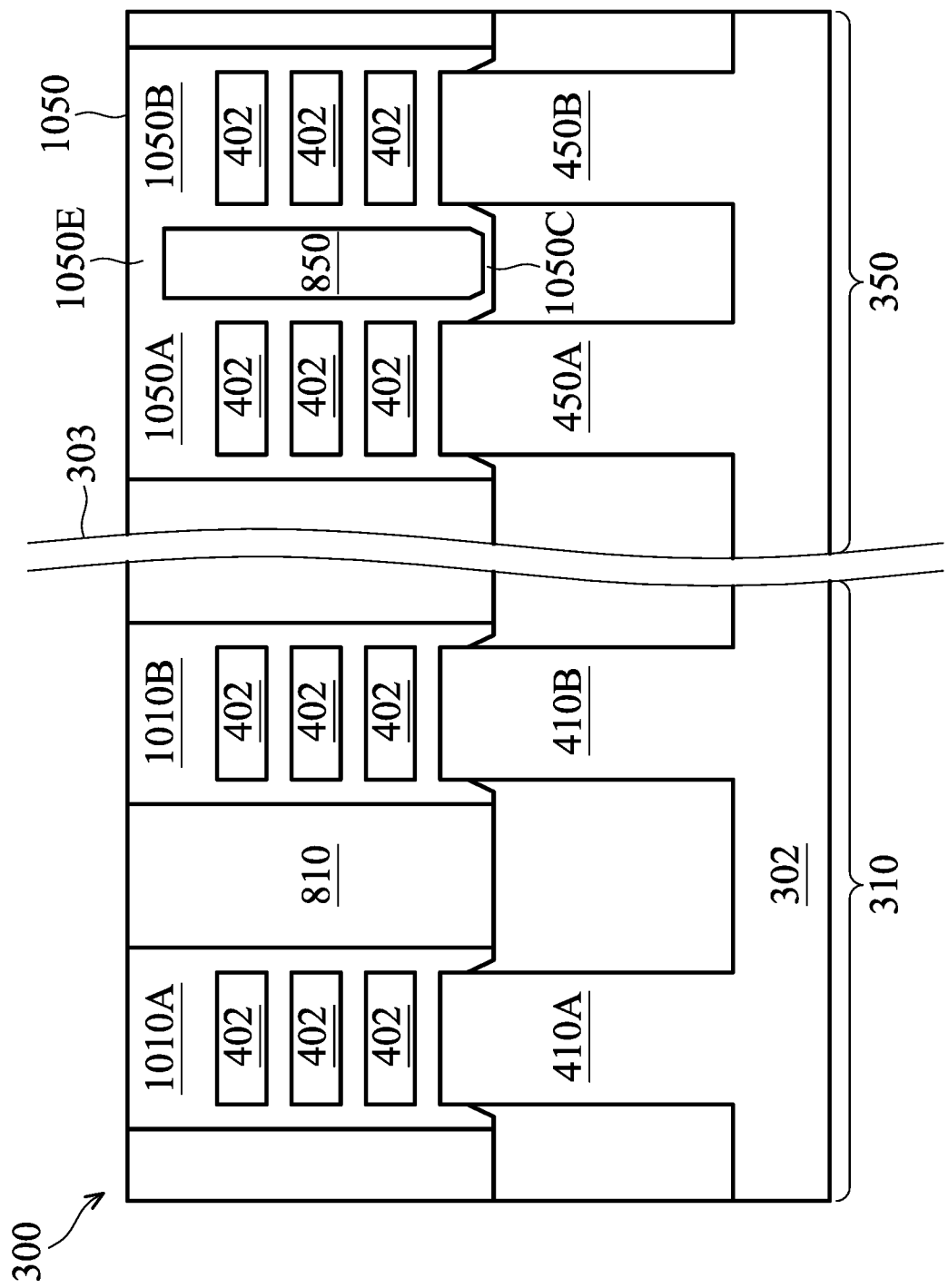

FIGS. 12A and 12B are cross-sectional views of the GAA FET device 300 including the active gate structures 1010A and 1010B in the area 310 and the active gate structure 1050 in the area 350, in alternative or additional embodiments. The cross-sectional view of FIGS. 12A-B are each cut in a direction along the lengthwise direction of an active/dummy gate structure of the GAA FET device 300 (e.g., cross-section A-A indicated in FIG. 1).

As shown, in the area 310, the active gate structures 1010A and 1010B separate from each other still with the dummy fin structure 810; and in the area 350, the wrapping portions 1050A and 1050B of the active gate structure 1050 connect to each other further with yet another connecting portion 1050E disposed above the dummy fin structure 850. In the illustrated embodiments of FIGS. 12A-B, the dummy fin structures 810 and 850 may be formed higher than the active gate structures 1010A-B and 1050. As such, upon forming the active gate structures, in the area 310, the active gate structures 1010A and 1010B may have been separated from each other by the dummy fin structure 810. On the other hand (in the area 350), prior to forming the active gate structures, the dummy fin structure 850 may be "recessed" shorter, in some embodiments. Thus, when forming the active gate structure 1050, the connecting portion 1050E can be formed over the recessed dummy fin structure 850 to connect the wrapping portions 1050A and 1050B.

Figure 13:
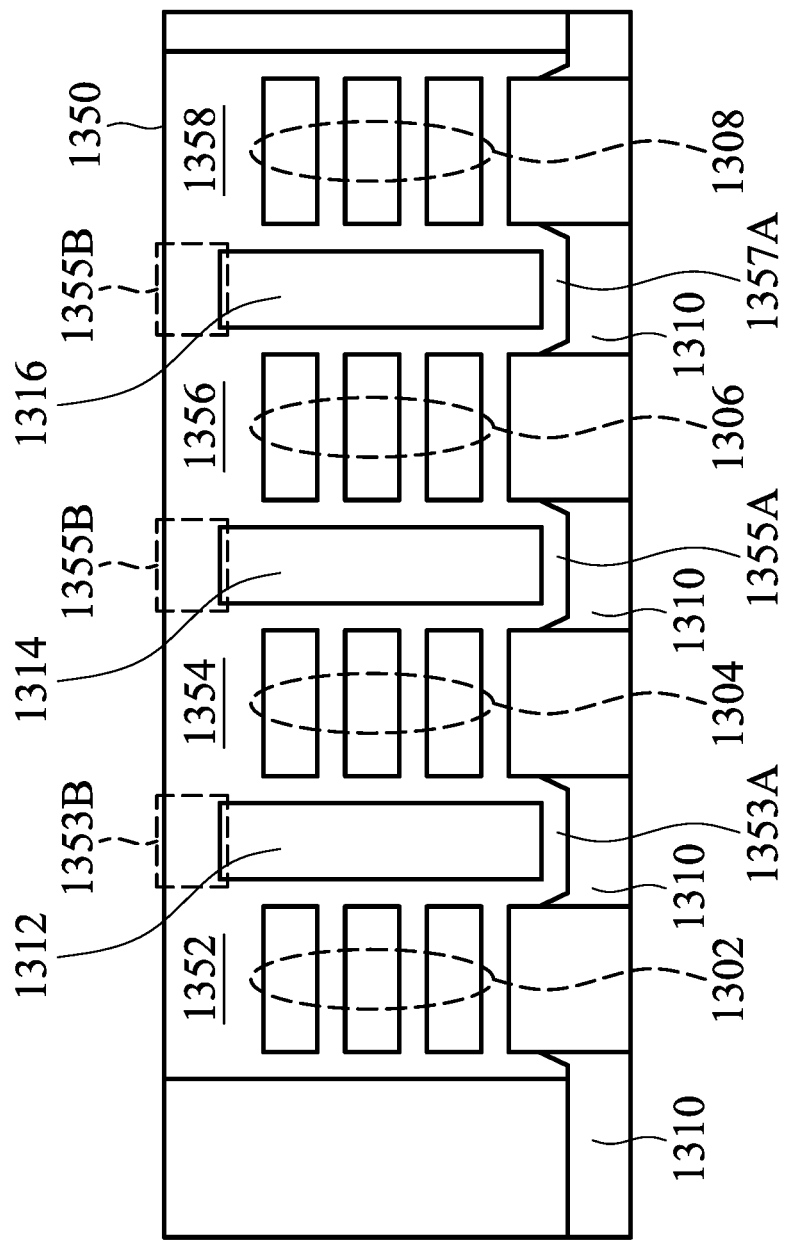
FIG. 13 illustrates a cross-sectional view of a GAA FET device including an active gate structures that wraps around four stacks of channel layers, in accordance with some embodiments.

FIG. 13 illustrates a cross-sectional view of a GAA FET device including an active gate structures 1350 that wraps around stacks of channel layers 1302, 1304, 1306, and 1308, in accordance with various embodiments. For example, the active gate structure 1350 includes wrapping portions 1352, 1354, 1356, and 1358 that wrap around the channel layers of the stacks 1302, 1304, 1306, and 1308, respectively. In addition to including connecting portions 1353A, 1355A, and 1357A that are disposed above the STIs 1310, respectively, the active gate structure 1350 can selectively include one or more connecting portions 1353B, 1355B, and 1357B that are disposed above dummy fin structures 1312, 1314, and 1316, respectively. Specifically, the connecting portion 1353A and 1353B (if present) can collectively connect the wrapping portions 1352 and 1354; the connecting portion 1355A and 1355B (if present) can collectively connect the wrapping portions 1354 and 1356; and the connecting portion 1357A and 1357B (if present) can collectively connect the wrapping portions 1356 and 1358.

Based on the above-discussed principles, an active gate structure can have various different combinations of connecting portions formed above dummy fin structures. For example, the connecting portions 1353B, 1355B, and 1357B can each be selectively formed, which renders 8 different combinations of the connecting portions. Table I below summarizes these 8 different combinations. In some embodiments, the number of combinations may change with a number of stacks of channel layers. For example, given a number of stacks of channel layers (n), the number of combinations is equal to $2^{n-1}$.

TABLE 1

| 1353B | 1355B | 1357B |
|---|---|---|
| present | present | present |
| not present | present | present |
| present | not present | present |
| present | present | not present |
| not present | not present | present |
| not present | present | not present |
| present | not present | not present |
| not present | not present | not present |

In one aspect of the present disclosure, a semiconductor device is disclosed. The semiconductor device includes a first stack structure comprising a first plurality of channel layers vertically spaced from one another. The first plurality of channel layers extend along a first direction. The semiconductor device includes a second stack structure comprising a second plurality of channel layers vertically spaced from one another. The second plurality of channel layers also extend along the first direction. The semiconductor device includes a first dielectric fin structure that also extends along the first direction. The semiconductor device includes a first gate structure that extends along a second direction perpendicular to the first direction. The first gate structure comprises a first portion that wraps around each of the first plurality of channel layers and a second portion that wraps around each of the second plurality of channel layers. The first dielectric fin structure separates the first and second portions from each other along the second direction. The first gate structure further comprises a third portion that connects the first and second portions to each other and is vertically disposed below the first dielectric fin structure.

In another aspect of the present disclosure, a semiconductor device is disclosed. The semiconductor device includes a first stack structure comprising a first plurality of channel layers vertically spaced from one another. The first plurality of channel layers extend along a first direction. The semiconductor device includes a second stack structure comprising a second plurality of channel layers vertically spaced from one another. The second plurality of channel layers also extend along the first direction. The semiconductor device includes an isolation structure that is disposed between the first and second stack structures along the a second direction perpendicular to the first direction and embeds respective lower portions of the first and second stack structures. The semiconductor device includes a first gate structure that extends along the second direction. The first gate structure comprises a first portion that wraps around each of the first plurality of channel layers and a second portion that wraps around each of the second plurality of channel layers. The first gate structure further comprises a third portion that connects the first and second portions to each other and contacts a top surface of the isolation structure.

In yet another aspect of the present disclosure, a method for making a semiconductor device is disclosed. The method includes forming a first fin structure and a second fin structure over a substrate. The first and second fin structures both extend along a first direction. Each of the first and second fin structures comprises a plurality of channel layers and a plurality of sacrificial layers vertically interleave with each other. The method includes depositing a cladding layer over first and second fin structures. The cladding layer includes at least one semiconductor material. The method includes etching the cladding layer, while remaining a portion of the cladding layer that laterally extends between the first and second fin structures The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first stack structure comprising a first plurality of channel layers vertically spaced from one another, wherein the first plurality of channel layers extend along a first direction;
   a second stack structure comprising a second plurality of channel layers vertically spaced from one another, wherein the second plurality of channel layers also extend along the first direction;
   a first dielectric fin structure that also extends along the first direction;
   a first gate structure that extends along a second direction perpendicular to the first direction, wherein the first gate structure comprises a first portion that wraps around each of the first plurality of channel layers and a second portion that wraps around each of the second plurality of channel layers, and wherein the first dielectric fin structure separates the first and second portions from each other along the second direction;
   wherein the first gate structure further comprises a third portion that connects the first and second portions to each other and is vertically disposed below the first dielectric fin structure.

2. The semiconductor device of claim 1, wherein the first gate structure further comprises a fourth portion that connects the first and second portions to each other and is vertically disposed above the first dielectric fin structure.

3. The semiconductor device of claim 1, wherein the first dielectric fin structure has a width extending along the second direction that ranges from about 1 nanometer (nm) to about 50 nm.

4. The semiconductor device of claim 1, wherein the third portion of the first gate structure has a constant height.

5. The semiconductor device of claim 1, wherein the third portion of the first gate structure has a minimum height at its center along the second direction and a maximum height at its end along the second direction.

6. The semiconductor device of claim 1, further comprising:
a third stack structure comprising a third plurality of channel layers vertically spaced from one another, wherein the third plurality of channel layers also extend along the first direction, and wherein the third stack structure is disposed opposite the first stack structure from the second stack structure; and
a second dielectric fin structure that also extends along the first direction;
wherein the first gate structure further comprises a fifth portion that wraps around each of the third plurality of channel layers and a sixth portion that connects the first and fifth portions to each other and is vertically disposed below the second dielectric fin structure.

7. The semiconductor device of claim 6, further comprising a dielectric cut structure that is vertically disposed above the second dielectric fin structure and separates the first portion and fifth portions from each other.

8. The semiconductor device of claim 1, further comprising:
a fourth stack structure comprising a fourth plurality of channel layers vertically spaced from one another, wherein the fourth plurality of channel layers also extend along the first direction;
a fifth stack structure comprising a fifth plurality of channel layers vertically spaced from one another, wherein the fifth plurality of channel layers also extend along the first direction;
a third dielectric fin structure that also extends along the first direction;
a second gate structure that also extends along the second direction, wherein the second gate structure wraps around each of the fourth plurality of channel layers;
a third gate structure that also extends along the second direction, wherein the third gate structure wraps around each of the fifth plurality of channel layers;
wherein the third dielectric structure electrically separates the second and third gate structures from each other.

9. The semiconductor device of claim 8, wherein the third dielectric fin structure has a width extending along the second direction that ranges from about 5 nm to about 1000 nm.

10. A semiconductor device, comprising:
a first stack structure comprising a first plurality of channel layers vertically spaced from one another, wherein the first plurality of channel layers extend along a first direction;
a second stack structure comprising a second plurality of channel layers vertically spaced from one another, wherein the second plurality of channel layers also extend along the first direction;
an isolation structure that is disposed between the first and second stack structures along a second direction perpendicular to the first direction and embeds respective lower portions of the first and second stack structures; and
a first gate structure that extends along the second direction, wherein the first gate structure comprises a first portion that wraps around each of the first plurality of channel layers and a second portion that wraps around each of the second plurality of channel layers;
wherein the first gate structure further comprises a third portion that directly connects the first and second portions to each other, is interposed between first stack structure and the second stack structure along the second direction, and contacts a top surface of the isolation structure.

11. The semiconductor device of claim 10, wherein the first gate structure further comprises a fourth portion that connects the first and second portions to each other, and wherein the fourth portion is vertically aligned with but separated from the third portion.

12. The semiconductor device of claim 10, wherein the third portion of the first gate structure has a constant height.

13. The semiconductor device of claim 10, wherein the third portion of the first gate structure has a minimum height at its center along the second direction and a maximum height at its end along the second direction.

14. The semiconductor device of claim 10, further comprising a dielectric cut structure that is vertically aligned with but separated from the third portion.

15. The semiconductor device of claim 10, further comprising a dielectric fin structure that also extends along the first direction and is vertically disposed above the isolation structure.

16. The semiconductor device of claim 15, wherein the dielectric fin structure has a width extending along the second direction that ranges from about 1 nanometer (nm) to about 50 nm.

17. The semiconductor device of claim 10, wherein the isolation structure includes a shallow trench isolation.

18. A semiconductor device, comprising:
a first stack structure comprising a first plurality of channel layers vertically spaced from one another, wherein the first plurality of channel layers extend along a first direction;
a second stack structure comprising a second plurality of channel layers vertically spaced from one another, wherein the second plurality of channel layers also extend along the first direction;
a dielectric fin structure that also extends along the first direction and is interposed between the first and second stack structures along a second direction perpendicular to the first direction; and
a gate structure that extends along the second direction;
wherein the first gate structure comprises a first portion wrapping around each of the first plurality of channel layers, a second portion wrapping around each of the second plurality of channel layers, a third portion connecting the first and second portions to each other and vertically disposed below the dielectric fin structure, and a fourth portion connecting the first and second portions to each other and vertically disposed above the dielectric fin structure.

19. The semiconductor device of claim 18, wherein the third portion of the first gate structure has a constant height.

20. The semiconductor device of claim 18, wherein the third portion of the first gate structure has a minimum height at its center along the second direction and a maximum height at its end along the second direction.

* * * * *